United States Patent
Senzaki et al.

(10) Patent No.: US 10,069,443 B2
(45) Date of Patent: Sep. 4, 2018

(54) DECHUCK CONTROL METHOD AND PLASMA PROCESSING APPARATUS

(71) Applicant: Tokyo Electron Limited, Tokyo (JP)

(72) Inventors: Shigeru Senzaki, Miyagi (JP); Shunichi Mikami, Miyagi (JP); Toshikatsu Tobana, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 452 days.

(21) Appl. No.: 13/719,509

(22) Filed: Dec. 19, 2012

(65) Prior Publication Data

US 2013/0153147 A1 Jun. 20, 2013

Related U.S. Application Data

(60) Provisional application No. 61/580,338, filed on Dec. 27, 2011, provisional application No. 61/696,462, filed on Sep. 4, 2012.

(30) Foreign Application Priority Data

Dec. 20, 2011 (JP) .................................. 2011-278415
Aug. 21, 2012 (JP) .................................. 2012-182706

(51) Int. Cl.
*H02N 13/00* (2006.01)
*C23F 1/08* (2006.01)
(Continued)

(52) U.S. Cl.
CPC ............... *H02N 13/00* (2013.01); *C23F 1/08* (2013.01); *H01J 37/32715* (2013.01); *H01L 21/6831* (2013.01)

(58) Field of Classification Search
USPC .................................... 361/234; 156/345.26
See application file for complete search history.

(56) References Cited

U.S. PATENT DOCUMENTS 5,684,669 A * 11/1997 Collins et al. ................ 361/234
5,737,178 A *  4/1998 Herchen ............ H01L 21/6831
                                                118/401

(Continued)

FOREIGN PATENT DOCUMENTS

JP    H08-078512    3/1996
JP    2004-040046   2/2004

(Continued)

*Primary Examiner* — Sylvia Macarthur
(74) *Attorney, Agent, or Firm* — IPUSA, PLLC

(57) ABSTRACT

A dechuck control method includes performing a discharge process by introducing an inert gas into a processing chamber and maintaining the pressure within the processing chamber at a first pressure; monitoring the pressure of a heat transmitting gas supplied to the processing object rear face and/or the leakage flow rate of the heat transmitting gas; obtaining the amount and polarity of the residual electric charge of the electrostatic chuck surface and applying a voltage for supplying an electric charge that is of the same amount as the residual electric charge but of the opposite polarity to a chuck electrode; evacuating the inert gas from the processing chamber while applying the voltage to the chuck electrode and reducing the pressure within the processing chamber to a second pressure; and turning off the voltage applied to the electrostatic chuck and dechucking the processing object from the electrostatic chuck.

18 Claims, 20 Drawing Sheets

(51) Int. Cl.
*H01L 21/683* (2006.01)
*H01J 37/32* (2006.01)

(56) References Cited

U.S. PATENT DOCUMENTS

| | | | | |
|---|---|---|---|---|
| 5,880,924 | A * | 3/1999 | Kumar et al. | 361/234 |
| 5,997,651 | A * | 12/1999 | Matsuse et al. | 118/725 |
| 6,500,299 | B1 * | 12/2002 | Mett et al. | 156/345.1 |
| 6,853,953 | B2 * | 2/2005 | Brcka | H01L 21/6831 700/108 |
| 6,872,322 | B1 * | 3/2005 | Chow | H01J 37/32862 134/1.1 |
| 7,592,261 | B2 * | 9/2009 | Ueda et al. | 438/706 |
| 8,313,612 | B2 * | 11/2012 | McMillin et al. | 156/345.54 |
| 2012/0160418 | A1 * | 6/2012 | Hanaoka | H01J 37/32082 156/345.38 |
| 2012/0304483 | A1 * | 12/2012 | Sirard | H01L 21/02057 34/289 |
| 2013/0153147 | A1 * | 6/2013 | Senzaki et al. | 156/345.26 |

FOREIGN PATENT DOCUMENTS

| | | | | |
|---|---|---|---|---|
| JP | 2010-040822 | | 2/2010 | |
| WO | WO9524764 | * | 9/1995 | H01L 21/6831 118/723 E |
| WO | WO0019592 | * | 4/2000 | H01L 21/6831 118/723 E |

* cited by examiner

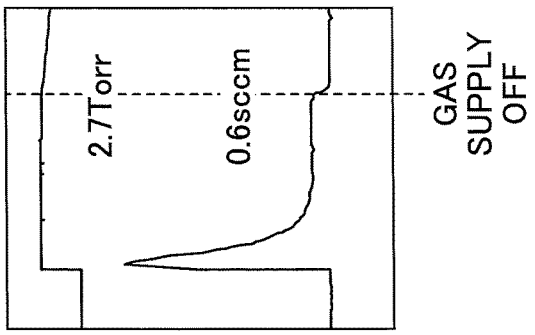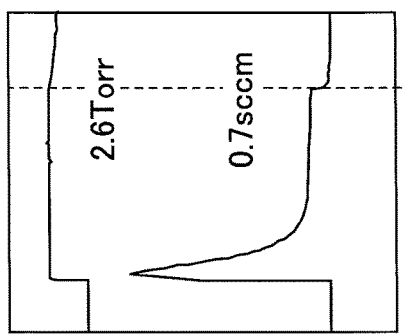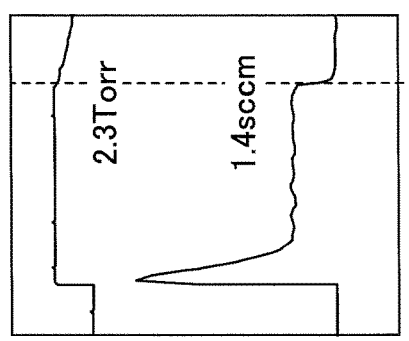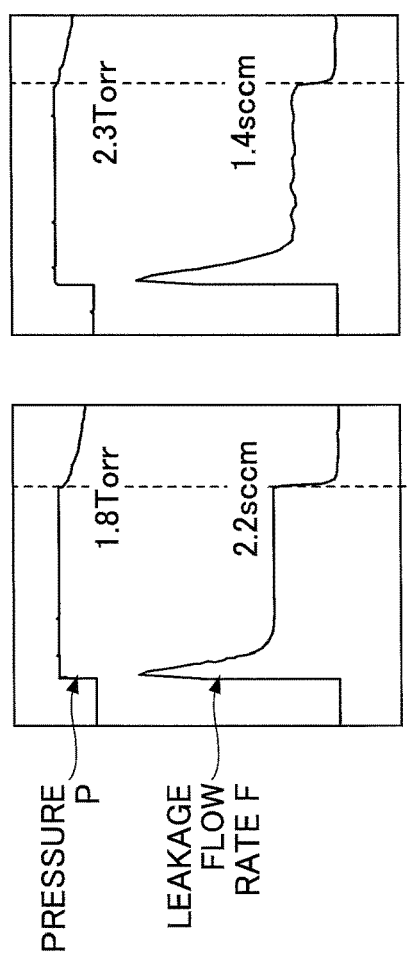

FIG.13

| VOLTAGE | He LEAKAGE VOLUME FLOW RATE |
|---|---|
| HV 0V (WAFER NOT SUCTIONED = DISCHARGE FINISHED STATE) | 4 |
| HV 100V | 3.7 |
| HV 200V | 3.6 |
| HV 300V | 3.3 |
| HV 400V | 2.9 |
| HV 500V | 1.9 |
| HV 700V | 1.3 |
| HV 1000V | 0.96 |
| HV 2500V (WAFER SUCTIONED = NON-DISCHARGED STATE) | 1 |

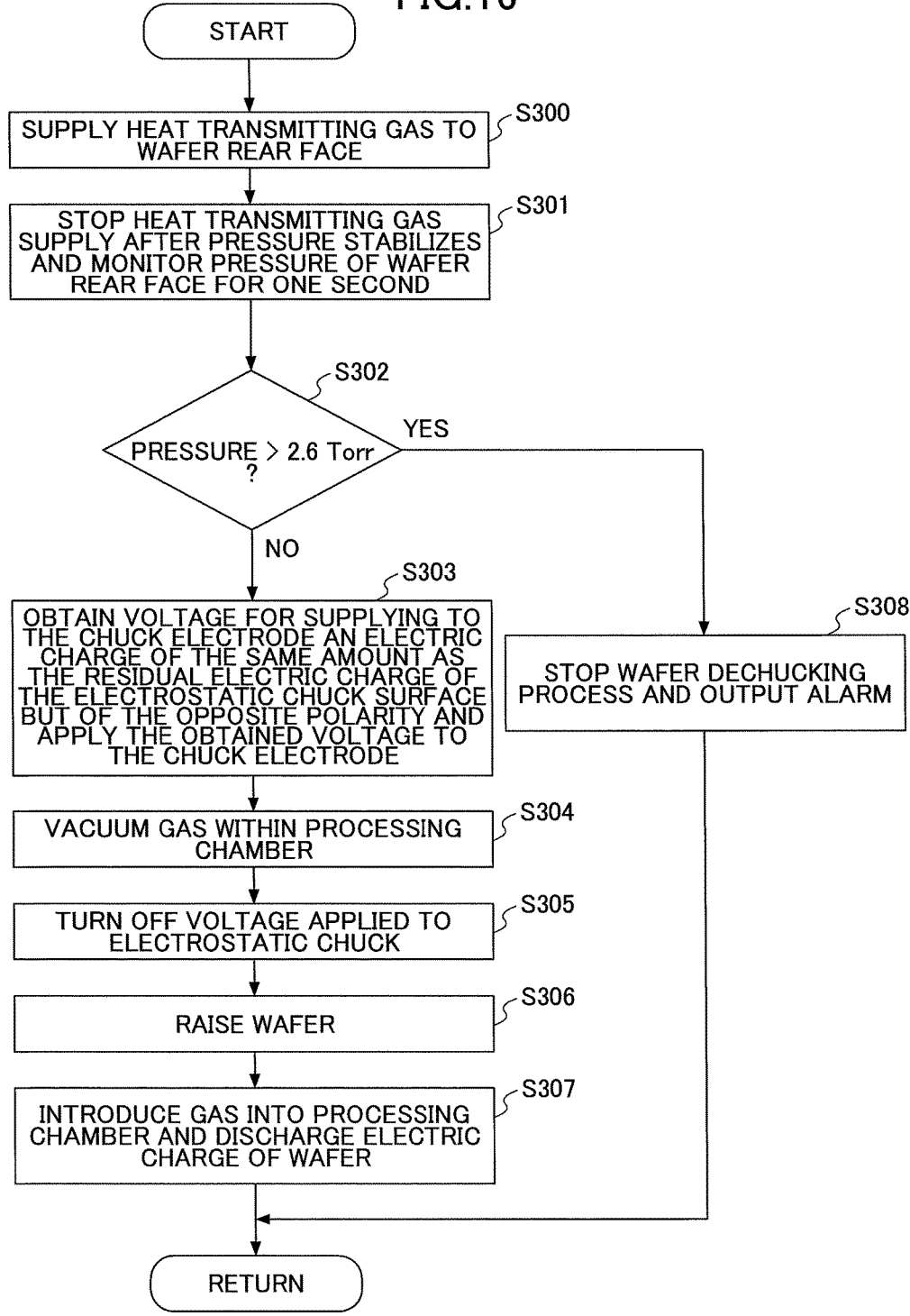

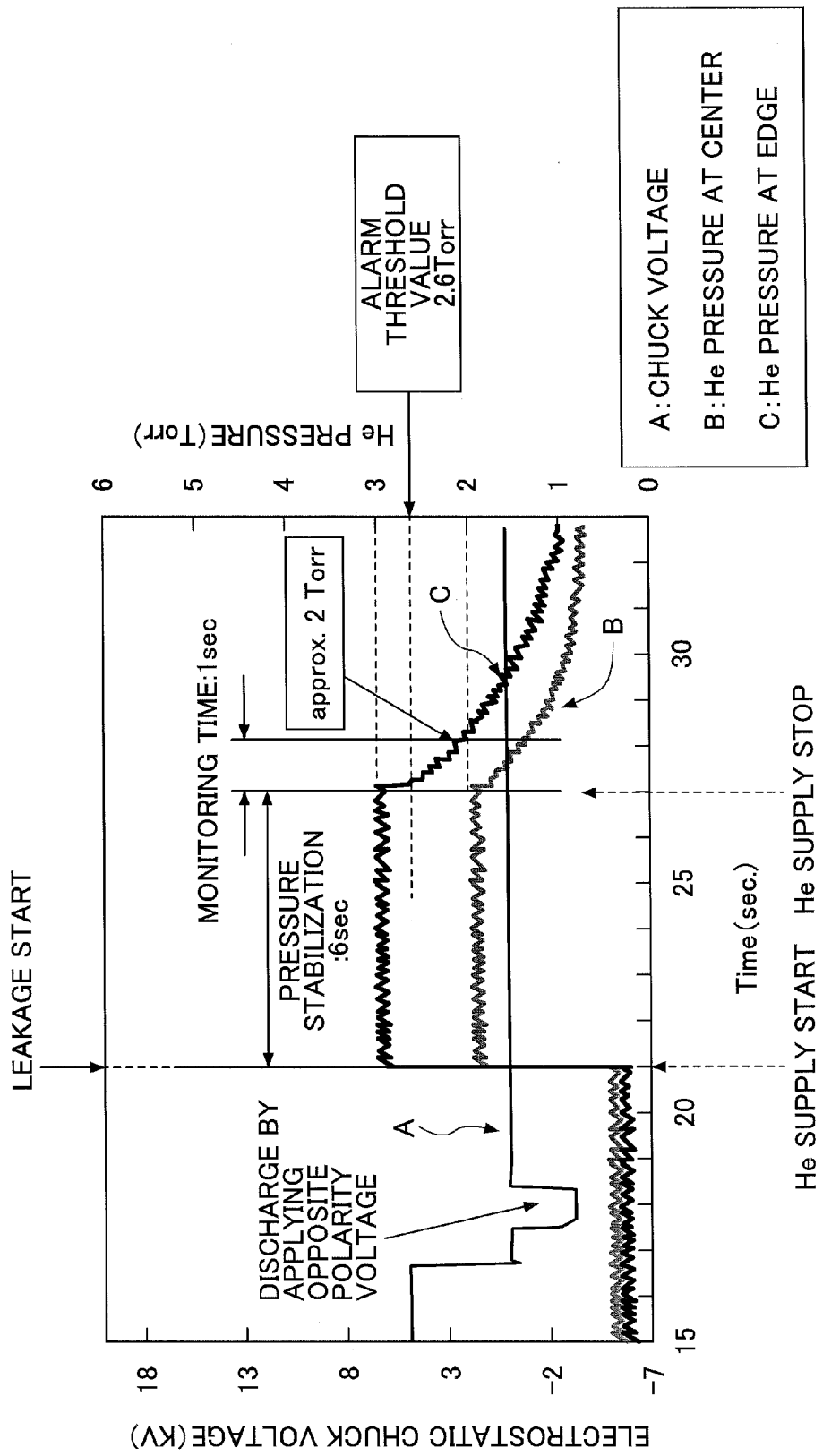

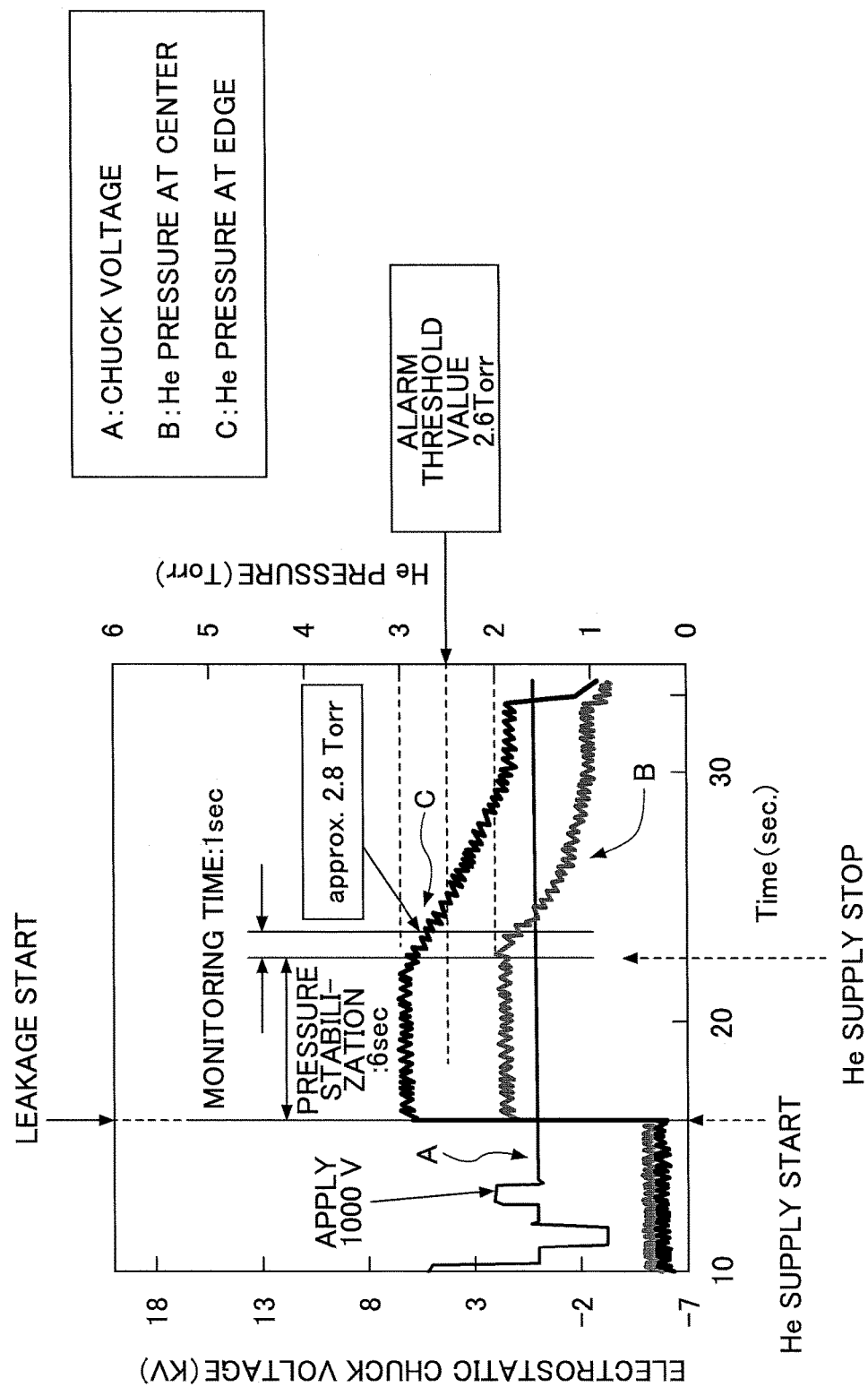

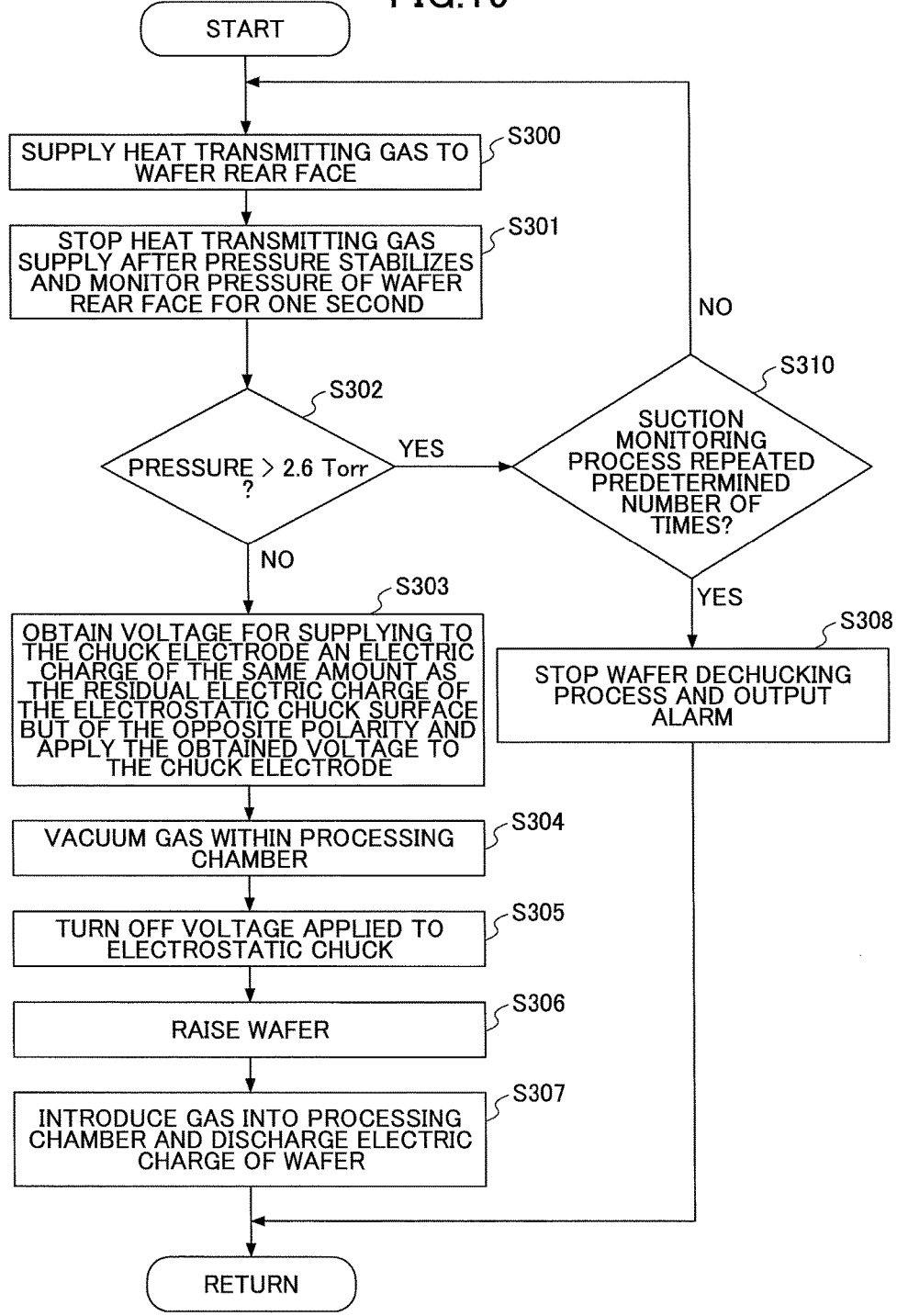

DECHUCK CONTROL METHOD AND PLASMA PROCESSING APPARATUS

CROSS-REFERENCE TO RELATED APPLICATIONS

This patent application is based on and claims the benefit of priority of Japanese Patent Application No. 2011-278415 filed on Dec. 20, 2011; U.S. Patent Application No. 61/580,338 filed on Dec. 27, 2011; Japanese Patent Application No. 2012-182706 filed on Aug. 21, 2012; and U.S. Patent Application No. 61/696,462 filed on Sep. 4, 2012; the entire contents of which are incorporated herein by reference.

BACKGROUND OF THE INVENTION

1. Field of the Invention

The present invention relates to a dechuck control method and a plasma processing apparatus.

2. Description of the Related Art

A plasma process is often performed in vacuum by evacuating gas from a processing chamber. In such a process, a processing object is placed on an electrostatic chuck (ESC) that is arranged on a stage of the processing chamber.

The electrostatic chuck includes a conductive sheet-type chuck electrode that is arranged between dielectric members. When performing a plasma process, a voltage from a direct current voltage source is applied to the electrostatic source so that the processing object is chucked to the electrostatic chuck by a Coulomb force generated from the voltage application. After the plasma process is completed, the voltage applied to the electrostatic chuck is turned off so that the processing object may be dechucked from the electrostatic chuck. To dechuck the processing object, a discharge process is performed, which involves introducing inert gas into the processing chamber to maintain the pressure within the processing chamber at a predetermined pressure level, applying a voltage of the opposite polarity with respect to the voltage applied to the electrostatic chuck during the plasma process, and then turning off the voltage application so that the electric charges of the electrostatic chuck and the processing object may be discharged. Then, support pins are raised so that the processing object may be lifted and dechucked from the electrostatic chuck.

However, the surface of the electrostatic chuck may change over time. For example, foreign substances such as reactive products generated during the plasma process may gradually build up on the surface of the electrostatic chuck to form an insulating film. In such a case, an electric charge may accumulate in the insulating film so that even when the voltage applied to the electrostatic chuck is turned off, a residual electrical charge may remain on the surface of the electrostatic chuck. Such a residual electric charge cannot be discharged by the above discharge process. As a result, the support pins may be raised while an electrostatic suction force created by the residual electric charge still remains on the surface of the electrostatic chuck so that the processing object may crack or be displaced, for example.

In this regard, Patent Document 1 discloses a system for releasing a wafer from an electrostatic chuck that involves suspending operations of the support pins for raising the wafer in order to supply to the wafer via the support pins an electric charge of an opposite polarity with respect to the electric charge generated at the rear face of the wafer rear face, and continuing to supply the electric charge from the support pins until the residual electric charge at the rear face of the wafer falls below a predetermined value. In this way, the electric charge remaining at the rear face of the wafer may be discharged.

PATENT DOCUMENT

[Patent Document 1] Japanese Laid-Open Patent Publication No. 2004-40046

Although the discharge method disclosed in Patent Document 1 enables the cancelling of the electric charge generated at the rear face of the wafer, it cannot be used to discharge the residual electric charge remaining on the surface of the electrostatic chuck. Thus, even if the discharge method of Patent Document 1 is implemented, it may be difficult to dechuck the processing object from the electrostatic chuck when a suction force is generated by the residual electric charge accumulated in the insulating film formed on the surface of the electrostatic chuck.

SUMMARY OF THE INVENTION

It is a general object of at least one embodiment of the present invention to provide a dechuck control method that substantially obviates one or more problems caused by the limitations and disadvantages of the related art.

In one embodiment of the present invention, a dechuck control method is provided for dechucking a processing object from an electrostatic chuck that electrostatically attracts the processing object and includes a chuck electrode. The dechuck control method includes the steps of performing a discharge process after a plasma process by introducing an inert gas into a processing chamber and maintaining a pressure within the processing chamber at a first pressure; monitoring at least one of a pressure of a heat transmitting gas supplied to a rear face of the processing object that is placed on the electrostatic chuck and a leakage flow rate of the heat transmitting gas leaking from the rear face of the processing object; obtaining an amount of residual electric charge of a surface of the electrostatic chuck and a polarity of the residual electric charge based on a monitoring result of the monitoring step, obtaining a voltage for supplying to the chuck electrode an electric charge that is of the same amount as the residual electric charge and of the opposite polarity with respect to the polarity of the residual electric charge, and applying the obtained voltage to the chuck electrode; evacuating the inert gas within the processing chamber while applying the obtained voltage to the chuck electrode and reducing the pressure within the processing chamber to a second pressure; and turning off the obtained voltage applied to the electrostatic chuck and dechucking the processing object from the electrostatic chuck using a support pin.

In one preferred embodiment, the second pressure may be achieved by vacuuming the inert gas until the pressure within the processing chamber is reduced to a pressure at which movement of an electric charge of the processing object through gas within the processing chamber ceases to occur according to Paschen's Law.

In another preferred embodiment, the evacuating step may include vacuuming the inert gas such that an order of magnitude of the pressure within the processing chamber after evacuation is reduced by at least one digit compared to an order of magnitude of the pressure within the processing chamber before evacuation.

In another preferred embodiment, the pressure within the processing chamber during the monitoring step may be greater than or equal to the first pressure.

In another preferred embodiment, after turning off the obtained voltage applied to the chuck electrode, the processing object may be raised from the electrostatic chuck using the support pin and gas may be reintroduced into the processing chamber.

In another preferred embodiment, the surface of the electrostatic chuck may include a dielectric member that covers the chuck electrode; and the volume resistivity of the dielectric member may be greater than or equal to $1 \times 10^{14}$ Ωcm.

In another preferred embodiment, the dechuck control method may be automatically implemented upon dechucking the processing object from the electrostatic chuck that has been in use for at least a predetermined period of time.

In another preferred embodiment, the monitoring step may include detecting at least one pressure value of the heat transmitting gas within a time period after stopping the supply of the heat transmitting gas during which time period the pressure of the heat transmitting gas changes by at least 50%; and stopping the step of dechucking the processing object from the electrostatic chuck when the detected pressure value of the heat transmitting gas is greater than 2.6 Torr (346.6 Pa).

In another preferred embodiment, the time period during which the pressure of the heat transmitting gas changes by at least 50% may be within one second.

In another preferred embodiment, the monitoring step may include repeating a detecting process of detecting at least one pressure value of the heat transmitting gas within the time period during which the pressure of the heat transmitting gas changes by at least 50%, the detecting process being repeated up to a predetermined number of times while the detected pressure value is greater than 2.6 Torr (346.6 Pa); and stopping the step of dechucking the processing object from the electrostatic chuck using the support pin when the detected pressure value continues to be greater than 2.6 Torr (346.6 Pa) after repeating the detecting process the predetermined number of times.

In another preferred embodiment, the dechuck control method may be automatically implemented upon dechucking the processing object from the electrostatic chuck in a first case where the detected pressure value of the heat transmitting gas is greater than or equal to 2.6 Torr (346.6 Pa) or a second case where the leakage flow rate of the heat transmitting gas leaking from the rear face of the processing object is less than or equal to 0.3 sccm.

In another preferred embodiment, when the heat transmitting gas is supplied from plural heat transmitting gas supply ports, the monitoring step may include monitoring at least one of a pressure of the heat transmitting gas supplied from an outermost heat transmitting gas supply port of the heat transmitting gas supply ports and the leakage flow rate of the heat transmitting gas leaking from the rear face of the processing object.

In another aspect of the present invention, a plasma processing apparatus is provided that includes an electrostatic chuck that electrostatically attracts a processing object and includes a chuck electrode; a control unit that performs a discharge process after a plasma process by introducing an inert gas into a processing chamber and maintaining a pressure within the processing chamber to a first pressure; and a monitor that detects at least one of a pressure of a heat transmitting gas supplied to a rear face of the processing object that is placed on the electrostatic chuck and a leakage flow rate of the heat transmitting gas leaking from the rear face of the processing object; wherein the control unit performs the steps of applying a voltage obtained based on a monitoring result of the monitor to the chuck electrode, evacuating the inert gas within the processing chamber, and reducing the pressure within the processing chamber to a second pressure; and turning off the voltage applied to the chuck electrode and dechucking the processing object from the electrostatic chuck using a support pin.

BRIEF DESCRIPTION OF THE DRAWINGS

FIGS. 5A-5D are graphs indicating monitoring results of the pressure and the leakage flow rate of a heat transmitting gas supplied to a wafer that is attached to the electrostatic chuck;

FIG. 13 is a table showing an exemplary relationship between the voltage applied to the electrostatic chuck and the He leakage volume flow rate;

FIG. 16 is a flowchart showing exemplary process steps for performing a suction monitoring process according to a first modified embodiment;

FIG. 17 is a graph showing an exemplary status of the electrostatic chuck monitored in the suction monitoring process according to the first modified embodiment;

FIG. 18 is a graph showing another exemplary status of the electrostatic chuck monitored in the suction monitoring process according to the first modified embodiment; and FIG. 19 is a flowchart showing exemplary process steps for performing a suction monitoring process according to a second modified embodiment.

DETAILED DESCRIPTION OF THE PREFERRED EMBODIMENTS

Figure 1:
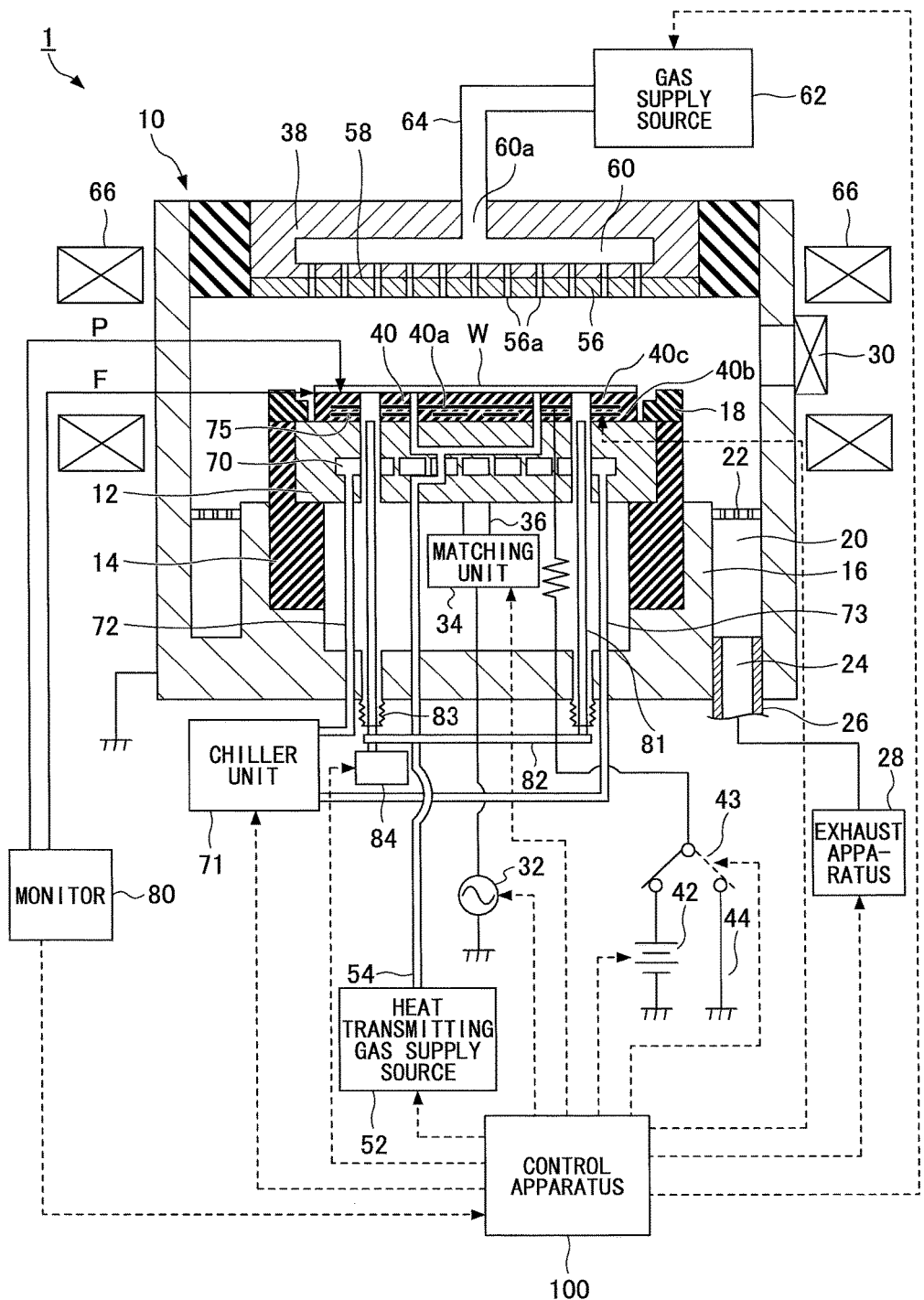
FIG. 1 is a block diagram showing an overall configuration of a plasma processing apparatus according to an embodiment of the present invention.

In the following, embodiments of the present invention are described with reference to the accompanying drawings.

It is noted that certain elements or features of embodiments of the present invention that may be substantially identical are given the same reference numerals and their overlapping descriptions may be omitted.

Introduction

In a plasma process, a voltage from a direct current voltage source is applied to an electrostatic chuck so that a processing object is chucked to the electrostatic chuck by a Coulomb force generated by the voltage application. To dechuck the processing object from the electrostatic chuck after the plasma process is completed, the voltage applied to the chuck electrode is turned off and the electric charge on the surface of the electrostatic chuck is discharged so that the suction force applied to the processing object from the electrostatic chuck surface may be weakened. In this state, support pins are raised so that the processing object is lifted and dechucked from the electrostatic chuck.

After the plasma process, a heat transmitting gas supply is turned off, inert gas such as $N_2$ or Ar is introduced into the processing chamber, and the pressure within the processing chamber is maintained at a predetermined pressure (e.g., 100-400 mTorr) while a voltage of an opposite polarity with respect to the voltage applied to the chuck electrode during the plasma process is applied to the chuck electrode after which the voltage is turned off. By performing such a process, electric charges of the electrostatic chuck surface and the wafer may be discharged. Also, a discharge process may be performed by supplying a high-frequency electric power from a high-frequency power source to the processing chamber to generate plasma while applying the opposite polarity to the chuck electrode. In a conventional discharge process, the voltage applied to the chuck electrode is turned off after the discharge process.

It is noted that the surface of the electrostatic chuck changes over time. For example, when foreign substances such as reactive products that are generated during the plasma process adheres to the surface of the electrostatic chuck, electric charge may be accumulated in the foreign substances and a residual electric charge may remain on the surface of the electrostatic chuck even when the voltage applied to the chuck electrode is turned off.

Some conceivable ways of dealing with such residual electric charge include polishing the surface layer of the electrostatic chuck or cleaning the processing chamber so that the foreign substances accumulated on the surface of the electrostatic chuck may be removed, for example. However, in these cases, the foreign substances may not be completely removed, and even if they could be completely removed, the processing chamber has to be exposed to the atmosphere and the electrostatic chuck has to be removed from the processing chamber so that the operating rate of the plasma processing apparatus may be greatly reduced. Thus, a method is desired for electrically dechucking the processing object suctioned to the electrostatic chuck by the residual electric charge before cracking or other damage to the processing object occurs.

It is noted that in the case of using an electrostatic chuck that is fabricated by thermally spraying a dielectric member having a volume resistivity of $1\times10^{12}$-14 $\Omega$cm, a wafer may be removed from the electrostatic chuck by a conventional dechucking method using the discharge process. However, in the case of using a Coulomb type electrostatic chuck having a volume resistivity that is greater than or equal to $1\times10^{14}$ $\Omega$cm, it becomes more difficult for the electric charge at the surface of the electrostatic chuck to escape so that the electric charge is more likely to remain at the electrostatic chuck surface and merely performing the discharge process may be inadequate for dechucking the wafer from the electrostatic chuck.

Also, it is noted that recent applications include a mechanism for promptly adjusting the surface temperature of the electrostatic chuck with a heater (referred to as "heater-embedded electrostatic chuck" hereinafter). In the heater-embedded electrostatic chuck, a dielectric member having a high volume resistivity of at least $1\times10^{14}$ $\Omega$cm, for example, is used. That is, the heater-embedded electrostatic chuck uses a Coulomb type electrostatic chuck where electrostatic suction forces dominate so that an electric charge is more likely to remain on the electrostatic chuck surface. With the increased use of the heater-embedded electrostatic chuck, the problem of residual electric charge accumulated at the electrostatic chuck surface that creates a suction force and hinders a processing object from being dechucked from the electrostatic chuck is becoming more apparent.

Embodiments of the present invention according to one aspect relate to a dechuck control method for dechucking a processing object from an electrostatic chuck that may be implemented when such a heater-embedded electrostatic chuck is used and a plasma processing apparatus including a control unit for controlling such a dechuck control method. In another aspect, embodiments of the present invention may be implemented to control dechucking of the processing object from the electrostatic chuck when an emergency occurs, for example.

[Overall Configuration of Plasma Processing Apparatus]

In the following, an overall configuration of a plasma processing apparatus according to an embodiment of the present invention is described with reference to FIG. 1.

The plasma processing apparatus 1 shown in FIG. 1 corresponds to a RIE (reactive-ion etching) type plasma processing apparatus and includes a cylindrical chamber (processing chamber 10) made of metal such as aluminum or stainless steel, for example. The processing chamber 10 is grounded. It is noted that plasma processes such as etching may be performed on a processing object within the processing chamber 10.

The processing chamber 10 has a semiconductor wafer W (referred to as "wafer W" hereinafter) as a processing object arranged on a stage 12. The stage 12 may be made of aluminum, for example, and is supported by a tubular support 16 extending upward in a perpendicular direction from the bottom of the processing chamber 10 via an insulating tubular holder 14. A focus ring 18 made of quartz, for example, that forms a circle around the top face of the stage 12 is arranged on the top face of the tubular holder 14.

The inner wall of the processing chamber 10 and the outer wall of the tubular support 16 form an exhaust path 20. A circular baffle plate 22 is arranged over the exhaust path 20. An exhaust opening 24 is arranged at the bottom portion of the exhaust path 20 and is connected to an exhaust apparatus 28 via an exhaust pipe 26. The exhaust apparatus 28 includes a vacuum pump (not shown) and is configured to depressurize the interior of the processing chamber 10 to a predetermined degree of vacuum. A gate valve 30 that opens and closes when the wafer W is transported into and out of the processing chamber 10 is arranged at the side wall of the processing chamber 10.

The stage 12 is electrically connected to a high-frequency power source 32 for generating plasma via a power feed rod 36 and a matching unit 34. The high-frequency power source 32 may apply a high-frequency electric power of 60 MHz, for example, to the stage 12. In this way, the stage 12 may also function as a lower electrode. A shower head 38 as an upper electrode at ground potential is arranged at the ceiling portion of the processing chamber 10. The plasma generating high-frequency electric power from the high-frequency power source 32 is capacitively applied between the stage 12 and the shower head 38.

The stage 12 has an electrostatic chuck 40 arranged on its upper face for holding the wafer W in place with electrostatic suction force. The electrostatic chuck 40 includes a sheet-type chuck electrode 40a made of a conductive film that is arranged between dielectric layers 40b and 40c corresponding to a pair of dielectric members. A direct current power source 42 is connected to the chuck electrode 40a via a switch 43. When the voltage from the direct current power source 42 is turned on, the electrostatic chuck 40 attracts the wafer W with a Coulomb force to hold the wafer W in place.

When the voltage applied to the chuck electrode 40a is turned off, the direct current power source 42 is connected to a grounding unit 44 by the switch 43. In the following descriptions, it is assumed that when the voltage applied to the chuck electrode 40a is turned off, the chuck electrode 40a is grounded.

A heat transmitting gas supply source 52 supplies a heat transmitting gas such as He gas or Ar gas to the rear face of the wafer W that is arranged on the electrostatic chuck 40 via a gas supply line 54. The shower head 38 at the ceiling portion includes an electrode plate 56 having plural gas vent holes 56a and an electrode support 58 that detachably supports the electrode plate 56. A buffer chamber 60 is arranged within the electrode support 58. The buffer chamber 60 includes a gas inlet 60a that is connected to a gas supply source 62 via a gas supply pipe 64. In this way, a desired gas may be supplied to the processing chamber 10 from the shower head 38.

Plural (e.g., three) support pins 81 are arranged within the stage 12 to raise and lower the wafer W and transfer the wafer W to and from an external transporting arm (not shown). The support pins 81 are driven to move up and down by the power of a motor 84 that is transmitted to the support pins 81 via a connection member 82. The support pins 81 are arranged to penetrate through the processing chamber 10 to the exterior via through holes, and bellows 83 are arranged at the bottom of the through holes in order to maintain the airtight seal of the vacuum within the processing chamber 10 from the external atmosphere.

A magnet 66 in a two-tier circular or concentric structure is arranged around the processing chamber 10. In a plasma generating space between the shower head 38 and the stage 12 within the processing chamber 10, a vertical RF electric field is created by the high-frequency power source 32 and a high-frequency electric power is discharged so that high density plasma is generated near the surface of the stage 12.

A refrigerant pipe 70 is arranged within the stage 12. A refrigerant at a predetermined temperature is supplied to and circulated within the refrigerant pipe 70 from a chiller unit 71 via pipes 72 and 73. Also, a heater 75 is embedded in the electrostatic chuck 40. The heater 75 may have a desired alternating current voltage applied thereon from an alternating current power source (not shown). In this way, the processing temperature of the wafer W on the electrostatic chuck 40 may be adjusted to a desired temperature through cooling by the chiller unit 71 and heating by the heater 75.

Further, a monitor 80 is arranged to monitor the pressure of the heat transmitting gas supplied to the rear face of the wafer W. The pressure is measured using a pressure sensor (not shown) arranged at the rear face of the wafer W. The monitor 80 may also monitor the leakage flow rate of the heat transmitting gas leaking from the rear face of the wafer W. The leakage flow rate may be measured by a flow rate sensor (not shown) that is arranged at a side face of the wafer W. It is noted that the monitor 80 may be arranged to monitor both the pressure of the heat transmitting gas and the leakage flow rate of the heat transmitting gas, or the monitor 80 may alternatively be arranged to monitor either one of the above.

A control apparatus 100 is arranged to control operations of the various units of the plasma processing apparatus 1 such as the gas supply source 62, the exhaust apparatus 28, the heater 75, the direct current voltage source 42, the switch 43, the matching unit 34, the high-frequency power source 32, the heat transmitting gas supply source 52, the motor 84, and the chiller unit 71. Also, the control apparatus 100 may obtain from the monitor 80 the pressure P of the heat transmitting gas supplied to the rear face of the wafer W and the leakage flow rate F of the heat transmitting gas. Further, the control apparatus 100 is connected a host computer (not shown).

The control apparatus 100 includes a CPU (central processing unit), a ROM (read-only memory), and a RAM (random access memory) (not shown), for example. The CPU of the control apparatus 100 executes a plasma process according to a recipe stored in a storage area. The recipe includes apparatus control information specifying processing conditions of the plasma process such as the processing time, the processing chamber temperatures (e.g., upper electrode temperature, processing chamber side wall temperature, ESC temperature), the pressure (e.g., gas exhaust pressure), the high-frequency electric power voltage, the flow rates of various processing gases, and the heat transmitting gas flow rate, for example.

To perform etching in the plasma processing apparatus 1 with the above configuration, first, the gate valve 30 is opened so that the wafer W held on the transporting arm may be transported into the processing chamber 10. Then, the wafer W is raised from the transporting arm by the support pins 81 protruding from the surface of the electrostatic chuck 40 so that the wafer W is held on top of the support pins 81. Then, after the transporting arm exits the processing chamber 10, the support pins 81 are lowered into the electrostatic chuck 40 and the wafer W is placed on the electrostatic chuck 40.

After transporting the wafer W into the processing chamber 10, the gate valve 30 is closed, an etching gas is introduced into the processing chamber 10 from the gas supply source 62 at a predetermined flow rate, and the pressure within the processing chamber 10 is decreased to a predetermined level by the exhaust apparatus 28. Further, a high-frequency electric power at a predetermined level is applied from the high-frequency power source 32 to the stage 12. Also, a voltage from the direct current voltage source 42 is applied to the chuck electrode 40a of the electrostatic chuck 40 so that the wafer W may be fixed to the electrostatic chuck 40. The etching gas that is introduced from the shower head 28 is turned into plasma by the high-frequency electric power from the high-frequency power source 32, and in this way, plasma may be generated in the plasma generating space between the upper electrode (shower head 38) and the lower electrode (stage 12). In turn, the main face of the wafer W may be etched by the radicals and ions within the generated plasma.

To dechuck the wafer W from the electrostatic chuck 40 after completing the plasma etching process, the heat transmitting gas supply is turned off, inert gas is introduced into the processing chamber 10 to maintain the pressure within the processing chamber 10 at a predetermined pressure, and a voltage of the opposite polarity with respect to the voltage applied to the chuck electrode 40a during the plasma etching process is applied to the chuck electrode 40a after which the voltage applied to the chuck electrode is turned off. In this way, electric charges residing in the electrostatic chuck 40 and the wafer W may be discharged. In this state, the support pins 81 are raised so that the wafer W may be lifted from the electrostatic chuck 40 and dechucked from the electrostatic chuck 40. Then, the gate valve 30 is opened and the transporting arm is introduced into the processing chamber 10 and the support pins 81 are lowered so that the wafer W is held on the transporting arm. Then, the transporting arm exits the processing chamber 10, and a next wafer W may be transported into the processing chamber 10 by the transporting arm. By repeating the above processes, multiple wafers W may be successively processed.

The overall configuration of the plasma processing apparatus 1 according to an embodiment of the present invention has been described above. In the following, the volume resistivity and the suction force of dielectric members used in electrostatic chucks are described with reference to FIG. 2.

[Suction Force of Electrostatic Chuck]

Figure 2:
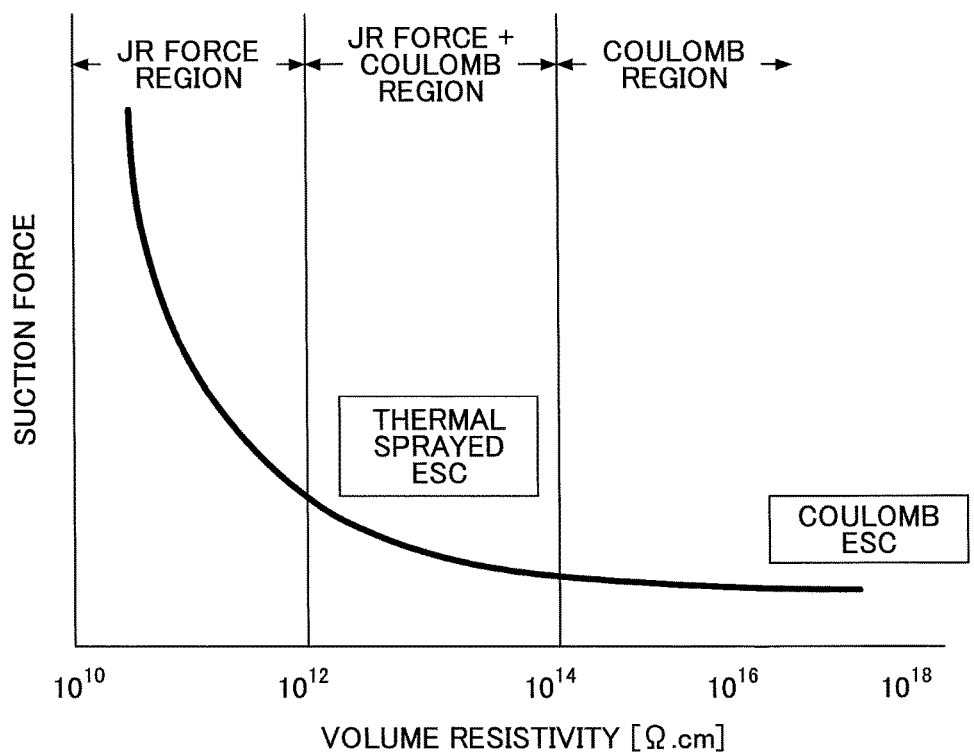
FIG. 2 is a graph showing a relationship between the volume resistivity and the suction force of an electrostatic chuck.

In the graph shown in FIG. 2, the horizontal axis represents the volume resistivity and the vertical axis represents the suction force. Electrostatic chucks include the Coulomb type electrostatic chuck that uses a ceramic dielectric member having a volume resistivity of at least $1 \times 10^{14}$ Ωcm, a JR (Johnsen-Rahbek) force type electrostatic chuck that uses a ceramic dielectric member having a volume resistivity of around $1 \times 10^{9-12}$ Ωcm, and the JR force type+Coulomb type electrostatic chuck that is formed by thermally spraying alumina or some other dielectric material having a volume resistivity of around $1 \times 10^{12-14}$ Ωcm. The heater-embedded electrostatic chuck corresponds to the Coulomb type electrostatic chuck, and the thermal sprayed electrostatic chuck corresponds to the JR force type+Coulomb type electrostatic chuck.

The Coulomb type electrostatic chuck typically uses a ceramic material such as alumina of high purity $Al_2O_3$ or aluminum nitride AlN. It is noted that by arranging the electrostatic chuck into a dot structure to disperse particles and heat transmitting gas existing on the rear face of the wafer, the area of contact between the electrostatic chuck and the wafer may be reduced so that the suction force may be reduced.

The JR force type electrostatic chuck typically has a resistivity controlling additive such as a metal oxide added to a ceramic material such as alumina or aluminum nitride in order to reduce volume resistivity. In the JR force type electrostatic chuck, a small amount of current is supplied to the electrostatic chuck surface so that a wafer may be attracted to the electrostatic chuck by the electrostatic suction force generated between the wafer and the electrostatic chuck surface. In the Coulomb type electrostatic chuck, a direct current is supplied to the chuck electrode so that the wafer may be attracted to the electrostatic chuck by the electrostatic suction force generated between the wafer and the chuck electrode.

As is shown in FIG. 2, the heater-embedded electrostatic chuck uses a dielectric member having a volume resistivity of at least $1 \times 10^{14}$ Ωcm. The heater-embedded electrostatic chuck uses a sintered ceramic with a high volume resistivity so that its suction force is within the Coulomb force region. Thus, logically, the suction force of the heater-embedded electrostatic chuck is weaker than that of the electrostatic chuck formed by thermally spraying alumina (thermal sprayed ESC). This can be determined from tension test results using a Si probe which indicate that the suction force of the heater-embedded electrostatic chuck is weaker than that of the electrostatic chuck formed by thermally spraying alumina (thermal sprayed ESC).

Since the heater-embedded electrostatic chuck uses a dielectric member having a volume resistivity of at least $1 \times 10^{14}$ Ωcm, an electric charge is more likely to be accumulated at the surface of the electrostatic chuck so that a wafer may be attracted to the electrostatic chuck by the residual electric charge and it may be difficult to dechuck the wafer by merely performing the discharge process described above. In the following, the residual electric charge of the electrostatic chuck is described with reference to FIG. 3, which represents a suction model of the electrostatic chuck 40.

[Residual Electric Charge of Electrostatic Chuck and Gas Vacuuming]

Figure 3:
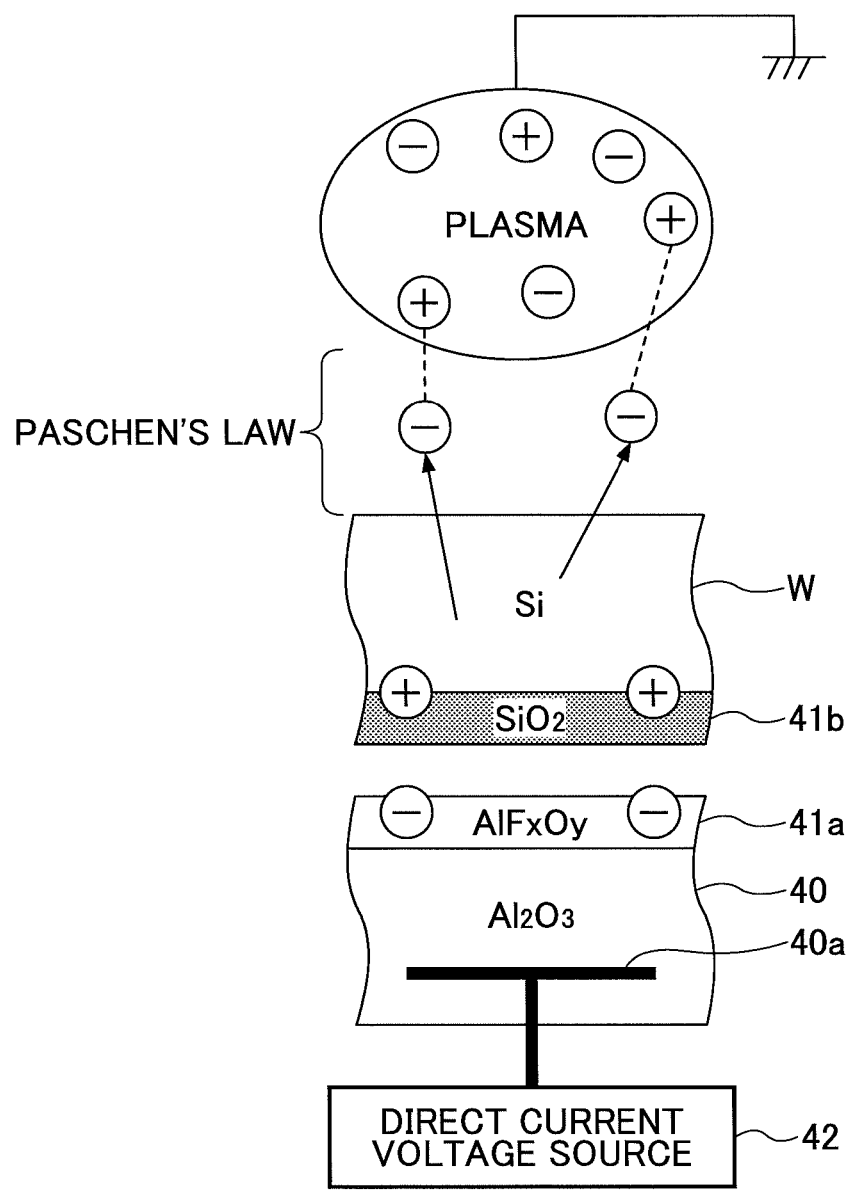
FIG. 3 is a diagram showing a suction model of an electrostatic chuck according to an embodiment of the present invention.

The suction model of FIG. 3 illustrates an electric state between the electrostatic chuck 40 and the wafer W. In the present example, the dielectric member of the electrostatic chuck 40 is made of alumina $Al_2O_3$. The sheet type chuck electrode 40a is arranged between the alumina $Al_2O_3$ dielectric members. A voltage from the direct current voltage source 42 is applied to the chuck electrode 40a. An insulating layer 41a that is formed by the gradual accumulation of a reactive product $AlF_xO_y$ generated during the plasma process resides on the surface of the electrostatic chuck 40. The wafer W placed on the electrostatic chuck 40 is made of silicon Si and includes a silicon oxide film ($SiO_2$ film) 41b that is arranged on its rear face. In another example, a silicon nitride film (SiN film) may be arranged on the rear face of the wafer W instead of the silicon oxide film 41b. When an insulating film is formed on the surface of the electrostatic chuck 40 as is shown in FIG. 3, residual electric charge is more likely to be generated.

Plasma is generated at the plasma generating space above the wafer W. The plasma is substantially at ground potential. It is noted that Paschen's Law determines whether the electric charge of the wafer W may move through the gas within the processing chamber 10 (gas discharge).

Paschen's Law indicates that the voltage at which electric discharge starts between parallel electrodes is a function of the product of the gas pressure and the gap between the electrodes. Electric discharge occurs when electrons that have been accelerated in the electric field collide with the gas within the processing chamber 10 to cause gas ionization. Accordingly, by vacuuming gas and reducing the pressure within the processing chamber 10, the likelihood of collision and electric discharge occurring in the processing chamber 10 may be reduced. On the other hand, when the amount of gas within the processing chamber 10 is greatly increased, the electrons may not be sufficiently accelerated before collision so that the likelihood of electrical discharge may be reduced in this manner as well.

For example, when the pressure within the processing chamber 10 is 100-400 mTorr, the electrons may be sufficiently accelerated to collide with the gas within the processing chamber 10 and cause electric discharge. As a result, movement of electrical charge occurs between the wafer W and the gas. On the other hand, when the pressure within the processing chamber 10 is reduced to no more than 10 mTorr, collision between electrons and the gas within the processing chamber 10 may be hindered so that electrical discharge may not occur. In this case, movement of electric charge may not occur between the wafer W and the gas. Accordingly, based on Paschen's Law, the electric potential of the wafer W may be determined by the pressure within the processing chamber 10 and the gap between the upper and lower electrodes.

The gas within the processing chamber 10 is vacuumed until the pressure within the processing chamber 10 is reduced to a level at which the electric charge of the wafer W would cease to move through the gas within the processing chamber 10 according to Paschen's Law. That is, the pressure within the processing chamber 10 does not necessarily have to be reduced to 10 mTorr. For example, the gas within the processing chamber 10 may be vacuumed so that the order of magnitude of the pressure within the processing chamber 10 is reduced by at least one digit.

It is noted that when the electrostatic chuck 40 is new, the reactive product generated during plasma processing is not yet accumulated on the surface of the electrostatic chuck 40 so that the insulating film 41a ($AlF_xO_y$ layer) does not exist. In this case, a Coulomb force is generated as designed and the electrostatic chuck 40 may be controlled in a desirable manner. However, the $AlF_xO_y$ layer gradually accumulates on the surface of the electrostatic chuck 40 (alumina $Al_2O_3$) to form the insulating layer 41a as a result of cleaning using fluorine gas or oxygen gas during plasma processing, for example. Since the insulating layer 41a has high resistivity, an electric charge may be easily accumulated and trapped in the insulating film 41a. In turn, the residual electric charge accumulated at the insulating film 41a may cause the generation of a Coulomb force between the insulating film 41a and the insulating film ($SiO_2$ film) 41b. In FIG. 3, a negative electric charge accumulated at the $AlF_xO_y$ layer insulating film 41a and a positive electric charge accumulated at the $SiO_2$ insulating film 41b are being attracted to each other by the Coulomb force. Since the distance between the electrostatic chuck 40 surface and the wafer W is smaller than the gap between the chuck electrode 40a and the wafer W, the Coulomb force generated between the electrostatic chuck 40 and the wafer W is relatively strong.

As the thickness of the insulating film 41a increases, the amount of residual electric charge also increases and the Coulomb force becomes even stronger. Ultimately, the attractive Coulomb force generated between the electrostatic chuck 40 and the wafer W may be so strong that the wafer W may not be properly dechucked from the electrostatic chuck 40 even when the above discharge process is performed and the wafer W may crack or be displaced as a result.

Although the electric charge at the wafer W may be substantially reduced or eliminated in the discharge process, when the voltage of the electrostatic chuck 40 surface is relatively high due to the residual electric charge, electric charges may start moving again from the gas within the processing chamber 10 to the wafer W according to Paschen's Law, and as a result, the wafer W may be attracted to the electrostatic chuck 40 once again by the Coulomb force. The reasons for such occurrence are described below with reference to FIGS. 4A-4B. In FIG. 4B (b-1), after performing a plasma process in which the pressure within the processing chamber 10 is controlled to 100 mTorr, a voltage from a direct current voltage source is turned off. In the illustrated example, the electric charge of the insulating film 41a on the electrostatic chuck 40 is −10, the electric charge of the chuck electrode 40a is +1, and the electric charge of the insulating film 41b of the wafer W is +9. In this case, the wafer W is attracted to the electrostatic chuck 40 by the residual electric charges accumulated in the insulating layers 41a and 41b (suction state by residual charge).

While the wafer W is in the above suction state, a discharge process according to an embodiment of the present invention as is shown in FIG. 4B (b-2) is performed. That is, based on the monitoring results of the residual electric charge and the polarity of the electric charge of the electrostatic chuck 40 surface, a voltage for supplying an electric charge of the same amount as the residual electric charge of the electrostatic chuck 40 surface but of the opposite polarity is obtained, and the obtained voltage is applied to the chuck electrode 40a. In the present example, the electric charge of the insulating film 41a is −10 so that the direct current voltage source is turned on to apply a voltage for supplying an electric charge of +10 to the chuck electrode 40a. The voltage applied to the chuck electrode 40a in the above example corresponds to a voltage for supplying an electric charge of the same amount as the residual electric charge of the electrostatic chuck 40 surface but of the opposite polarity that is obtained based on the monitoring results of the residual electric charge and the polarity of the residual electric charge of the electrostatic chuck 40 surface. According to an aspect of the present embodiment, a voltage for supplying an electric charge of the same amount as the residual electric charge of the electrostatic chuck 40 surface but of the opposite polarity that is obtained based on the monitoring results of the residual electric charge and the polarity of the electric charge of the electrostatic chuck surface 40 is turned on so that the potential of the electrostatic chuck 40 surface and the potential of the chuck electrode 40a are matched. In turn, balance may be achieved between the electric charge +10 of the chuck electrode 40a and the electric charge −10 remaining in the insulating film 41a. In this way, influences of the residual electric charge at the electrostatic chuck 40 surface on the wafer W may be substantially eliminated and the electric charge of the wafer W may also be reduced by being discharged to gas. In the present example, the electric charge of the wafer W is conceptually represented as 0.

When the voltage applied to the chuck electrode 40a is then turned off and the pressure within the processing chamber 10 is maintained at 100 mTorr, the electric charges move through the gas within the processing chamber 10 and the wafer W as a result of gas discharge according to Paschen's Law as is shown in FIG. 4B (b-3). That is, when gas discharge occurs, the electric charges move toward the plasma side corresponding to ground, the electric charges at the plasma side also move since an electric potential is generated at the electrostatic chuck 40 surface by the residual electric charge of the electrostatic chuck 40 surface, and the electric charge of gas within the processing chamber 10 also move. As a result, the residual electric charge of the electrostatic chuck 40 surface causes an electric charge to be accumulated at the insulating film 41b of the wafer W once more so that the wafer W is attracted to the electrostatic chuck 40 surface by the residual electrostatic charge. In the present example, the electric charge accumulated in the insulating film 41b of the wafer W is increased from 0 to +9. As a result, the residual electric charge of the electrostatic chuck 40 surface causes a Coulomb force to be generated between the wafer W and the electrostatic chuck 40 so that suction by the residual electric charge occurs once again. As is described above, since the distance between the wafer W and the electrostatic chuck 40 surface is smaller than the distance between the wafer W and the chuck electrode 40a, a relatively strong Coulomb force is generated between the wafer W and the electrostatic chuck 40 surface thereby causing the recurrence of the suction state by the residual electric charge.

Figure 4A:
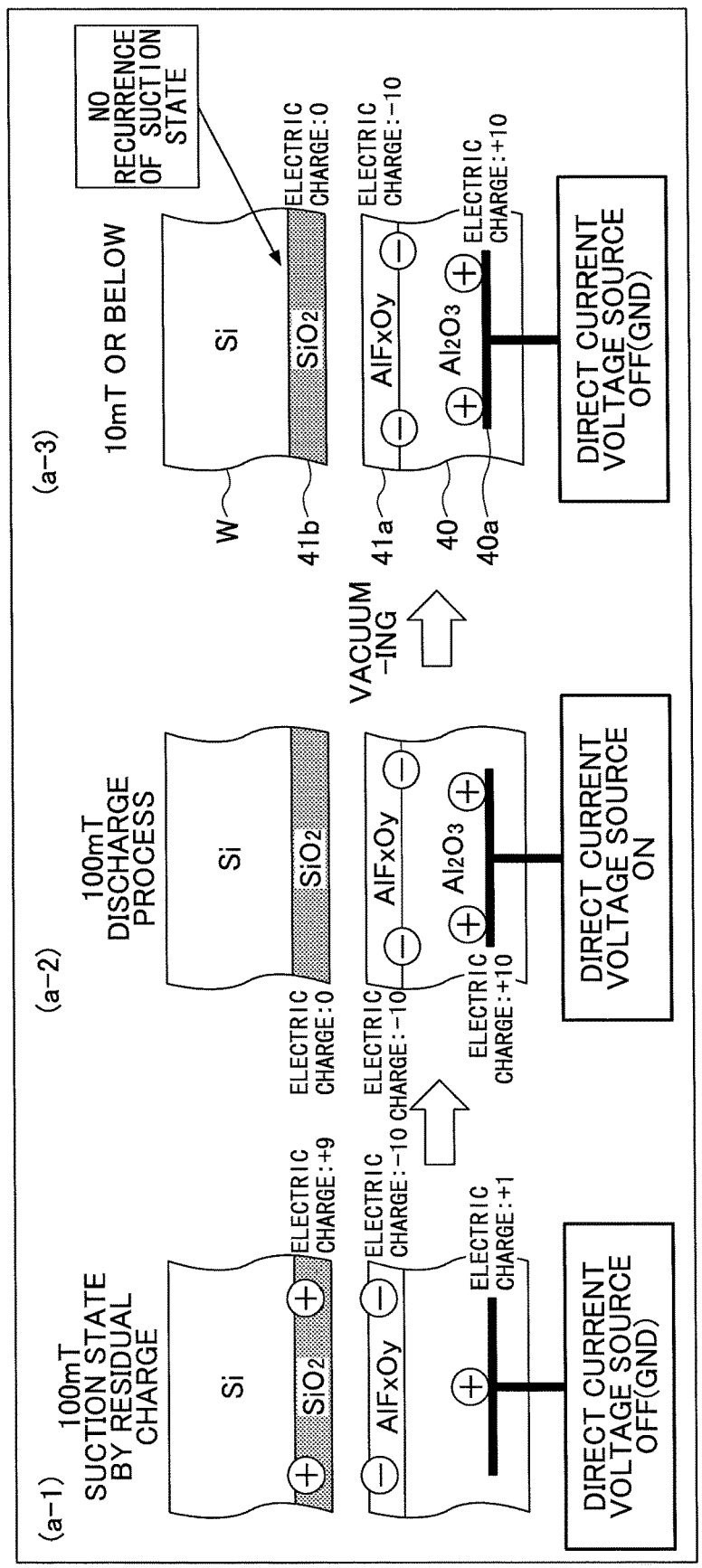
FIGS. 4A-4B are diagrams illustrating suction states of the electrostatic chuck.
Figure 4B:
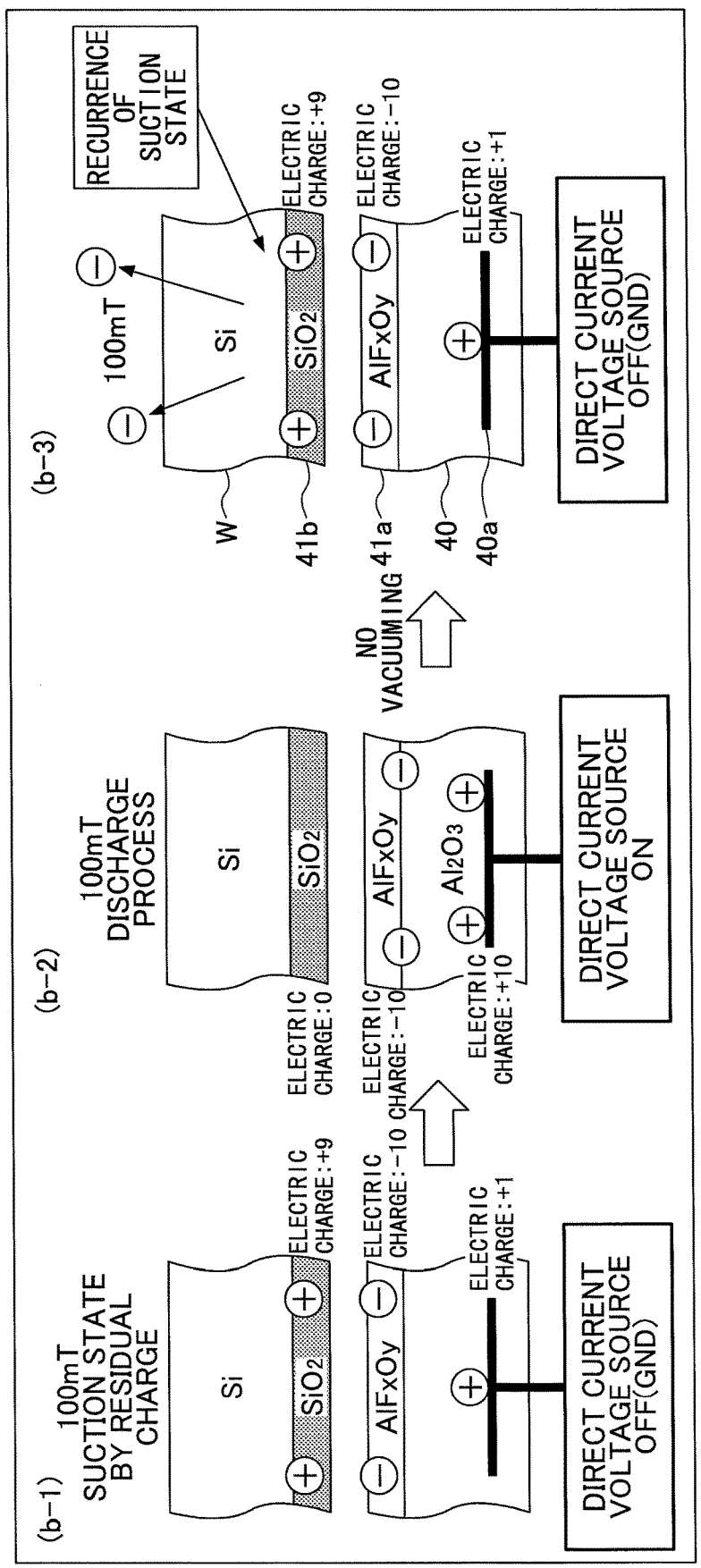

Accordingly, in a dechuck control method for dechucking the wafer W according to an embodiment of the present invention, gas within the processing chamber 10 may be vacuumed after the discharge process as is shown in FIG. 4A. That is, from the suction state by residual charge shown in FIG. 4A (a-1) (identical to FIG. 4B (b-1)), after matching the electric potential of the electrostatic chuck 40 surface and the electric potential of the chuck electrode 40a as is shown in FIG. 4A (a-2) (identical to FIG. 4B (b-2)), gas is vacuumed from the processing chamber 10 as is shown in FIG. 4A (a-3).

In FIG. 4A (a-3), the gas within the processing chamber 10 is vacuumed so that the pressure within the processing chamber 10 decreases to 10 mTorr or lower. In such a state, collision with gas is unlikely to occur according to Paschen's Law so that gas discharge may be prevented and the movement of electric charges between the wafer W and the gas may be prevented. In this way, the electric charge of the insulating film 41b of the wafer W may be maintained at 0, which corresponds to the electric charge after performing the discharge process. Also, since potential change (electric charge movement) at the $AlF_xO_y$ layer insulating film 41a formed on the electrostatic chuck 40 occurs at a relatively slow pace, the electric charge within the insulating layer 41a may not move for some time. Thus, the state shown in FIG. 4A (a-3) where the electric charge of the insulating film 41b of the wafer W is 0 and the electric charge of the insulating film 41a of the electrostatic chuck 40 is −10 may be maintained for a predetermined period of time and recurrence of the suction state by the residual electric charge may be prevented.

As can be appreciated, in the dechuck control method according to the present embodiment, a balance may be achieved between the electric charge of the $AlF_xO_y$ layer insulating film 41a and the electric charge of the chuck electrode 40a so that the electric charge of the wafer W may be discharged.

After the vacuuming process, the voltage applied to the electrostatic chuck 40 is turned off, and the wafer W is raised by the support pins 81. In the case where the electric charge of the wafer W is 0 as is shown in FIG. 4A (a-3), the wafer W may be carried outside without undergoing any further process. However, there may be cases where the electric charge of the wafer W is not 0. Accordingly, in the present embodiment, gas is subsequently introduced into the processing chamber 10 and the pressure within the processing chamber 10 is increased so that the electric charge of the wafer W may be released via the gas and plasma within the processing chamber 10. In this way, the wafer W may be carried outside after the electric charge of the wafer W is discharged to 0.

[Voltage Calculation Based on Monitoring Results]

A suction monitoring process according to an embodiment of the present invention may be performed while the inert gas introduced in the discharge process is maintained at the same pressure as that during the discharge process or a higher pressure (e.g., 100-400 mTorr) and the heat transmission gas supply is turned off. That is, after performing the discharge process of the present embodiment, when the wafer W is attracted to the electrostatic chuck 40 once more by the voltage from the residual electric charge of the electrostatic chuck 40 surface, the suction state by the residual electric charge may be monitored by supplying heat transmitting gas to the rear face of the wafer W and monitoring the pressure P of the heat transmitting gas and the flow rate F of the heat transmitting gas leaking from the rear face of the wafer W. It is noted that the polarity of the residual electric charge generated due to aging of the electrostatic chuck 40 surface varies depending on the processing conditions. Accordingly, the correlation between the monitoring results, the residual electric charges, and their polarity has to be determined beforehand.

Based on the monitoring results of the residual electric charge of the electrostatic chuck surface and its polarity, a control unit 115 of the control apparatus 100 (see FIG. 6) calculates the voltage for supplying to the chuck electrode 40a an electric charge that is of the same amount as the residual electric charge of the electrostatic chuck 40 surface but of the opposite polarity, and prompts application of the calculated voltage (corresponding to the discharge process of the present embodiment). FIGS. 5A-5D illustrate exemplary monitoring results used for the voltage calculation. That is, FIGS. 5A-5D are graphs indicating the monitoring results of the pressure P of the heat transmitting gas supplied to the rear face of the wafer W and the flow rate F of the heat transmitting gas leaking from the rear face of the wafer W. The suction state of the wafer W may be determined based on the monitoring results. Also, the voltage for supplying to the chuck electrode 40a an electric charge of the same amount as the residual electric charge of the electrostatic chuck 40 surface but of the opposite polarity may be calculated based on the monitoring results.

In the present example, the heat transmitting gas is introduced to the center portion of the wafer W rear face at 2 Torr and to the edge portion of the wafer W rear face at 3 Torr, and after the pressure of the heat transmitting gas stabilizes, the leakage flow rate F of the heat emitting gas at the edge portion is monitored. Since the leakage flow rate F varies depending on the suction state, the change in the leakage flow rate F is analyzed, and a voltage for supplying to the chuck electrode 40a an electric charge of the same amount as the residual electric charge of the electrostatic chuck 40 surface but of the opposite polarity is calculated based on the analysis result.

Also, the pressure P of the rear face of the wafer W is monitored one second after a valve (not shown) at the exhaust side is closed. The decreasing speed of the pressure P of the wafer W rear face varies depending on the suction state. Thus, the decreasing speed of the pressure P is analyzed, and a voltage for supplying to the chuck electrode 40a an electric charge of the same amount as the residual electric charge of the electrostatic chuck 40 surface but of the opposite polarity is calculated based on the analysis result. It is noted that the voltage for supplying to the chuck electrode 40a an electric charge of the same amount as the residual electric charge of the electrostatic chuck 40 surface but of the opposite polarity may also be obtained based on both the change in the leakage flow rate F and the decreasing speed of the pressure P.

FIG. 5A shows the monitoring results of the pressure P and the leakage flow rate F of the electrostatic chuck 40 that is new; FIG. 5B shows the monitoring results of the electrostatic chuck 40 that is still in the early stages of use; FIG. 5C shows the monitoring results of the electrostatic chuck 40 that is in the intermediate stages of use; and FIG. 5D shows the monitoring results of the electrostatic chuck 40 that is in the late stages of use. In the present example, the threshold value for determining the occurrence of suction by the residual electric charge is 2.6 Torr (346.6 Pa). Referring to FIG. 5A, when the electrostatic chuck 40 is new, the pressure P decreases dramatically from 3 Torr to 1.8 Torr one second after the supply of the heat transmitting gas is turned off. That is, when the electrostatic chuck 40 is new, the decreasing speed of the pressure P is relatively fast. Also, the pressure P is below the threshold value 2.6 Torr indicating that the wafer W may be properly dechucked in this case. Also, when the electrostatic chuck 40 is new, the leakage flow rate F is 2.2 sccm, which is a relatively large value indicating that the wafer W may be properly dechucked.

Referring to FIGS. 5B-5C, when the electrostatic chuck 40 is at the early stages or intermediate stages of use, the pressure P decreases from 3 Torr to 2.3 Torr and 2.6 Torr, respectively, one second after the supply of the heat transmitting gas is turned off. Although the decreasing speed of the pressure P is slower than that when the electrostatic chuck is new, the pressure P still does not exceed the threshold value 2.6 Torr indicating that the wafer W may be properly dechucked. Also, when the electrostatic chuck 40 is in the early stages of use as is shown in FIG. 5B or in the intermediate stages of use as is shown in FIG. 5C, the leakage flow rate F is 1.4 sccm and 0.7 sccm, respectively, which values are smaller than the leakage flow rate F when the electrostatic chuck 40 is new but still indicate that the wafer W may be properly dechucked.

On the other hand, when the electrostatic chuck 40 is in the late stages of use as is shown in FIG. 5D, the pressure P decreases from 3 Torr to 2.7 Torr one second after the supply of the heat transmitting gas is turned off. The pressure P in this case is greater than the threshold value 2.6 Torr indicating that the wafer W is attracted to the electrostatic chuck 40 by suction force. Also, when the electrostatic chuck 40 is in the late stages of use as is shown in FIG. 5D, the leakage flow rate F is 0.6 sccm, which is a small value indicating that the wafer W is attracted to the electrostatic chuck 40 by suction force. This may be due to the accumulation of a large amount of residual electric charge at the electrostatic chuck 40 surface that may hinder the flow of the heat transmitting gas.

Based on the monitoring results of the pressure P and the leakage flow rate F, the surface potential of the electrostatic chuck 40 may be estimated, and a voltage to be applied may be calculated according to the surface potential of the electrostatic chuck 40.

[Control Apparatus Configuration]

In consideration of the suction by the residual electric charge as described above, an embodiment of the present invention relates to a dechuck control method for preventing suction and re-suction by the residual electric charge and dechucking the wafer W that is electrostatically attracted to the electrostatic chuck 40. This dechuck control method is controlled by the control apparatus 100 of the plasma processing apparatus 1. In the following, a functional configuration of the control apparatus 100 that is configured to execute the dechuck control method of the present embodiment is described with reference to FIG. 6.

Figure 6:
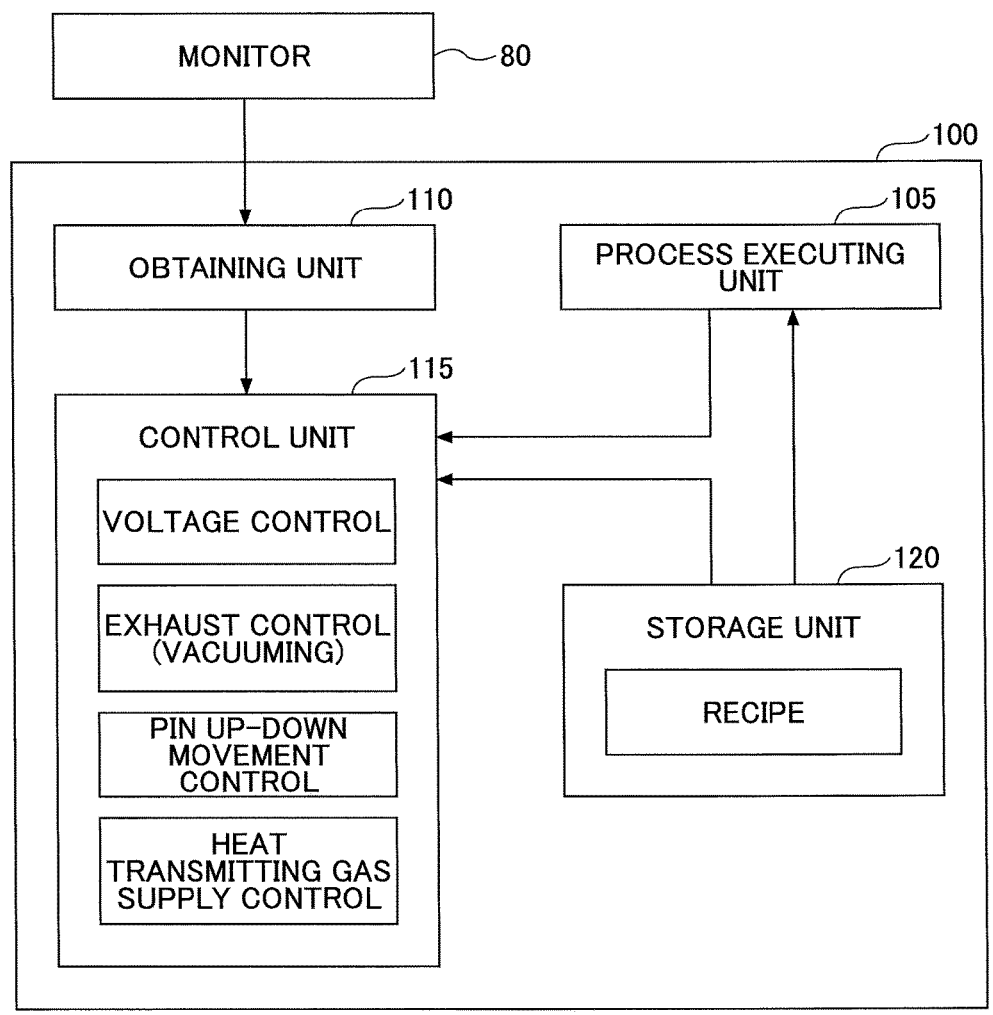
FIG. 6 is a block diagram showing a functional configuration of a control apparatus according to an embodiment of the present invention.

FIG. 6 is a block diagram showing the functional configuration of the control apparatus 100. The control apparatus 100 includes a process executing unit 105, an obtaining unit 110, the control unit 115, and a storage unit 120.

The process executing unit 105 selects a desired process recipe from plural process recipes that are stored in the storage unit 120 and executes an etching process according to the selected process recipe. Also, the process executing unit 105 executes a cleaning process according to a cleaning recipe that is stored in the storage unit 120.

The obtaining unit 110 obtains from the monitor 80 the pressure P of the heat transmitting gas supplied to the rear face of the wafer W and the leakage flow rate of the heat transmitting gas leaking from the wafer W rear face. The obtaining unit 110 may be arranged to obtain the pressure P and the leakage flow rate F at intervals of a predetermined time period.

The control unit 115 controls the units within the plasma processing apparatus 1. Of the various control operations performed by the control unit 115, the descriptions below relate to controlling the chucking and dechucking operations of the electrostatic chuck 40. To control the chucking and dechucking operations of the electrostatic chuck 40, the control unit 115 controls the voltage of the direct current voltage source 42, the vacuuming operations by the exhaust apparatus 28 (exhaust control), the up-down movement of the support pins 81 (pin up-down movement control), and the supply of the heat transmitting gas to the wafer W rear face (heat transmitting gas supply control).

The storage unit 120 has plural process recipes for executing etching processes and a cleaning recipe for executing a cleaning process stored beforehand. The storage unit 120 may be realized as a RAM or a ROM using a semiconductor memory, a magnetic disk, or an optical disk, for example. The recipes may be stored in a storage medium so that a driver (not shown) may read the recipes from the storage medium and store the recipes in the storage unit 120, for example. In another example, the recipes may be downloaded from a network (not shown) and stored in the storage unit 120. Also, it is noted that a DSP (digital signal processor) may be used instead of a CPU to realize the above functional units.

It is noted that the functions of the control apparatus 100 may be realized by software operations or hardware operations.

The functional configuration of the control apparatus 100 that executes the dechuck control method according to the present embodiment has been described above. In the following, the dechuck control method that is controlled by the control apparatus 100 is described with reference to FIG. 7.

[Control Apparatus Operations]

Figure 7:
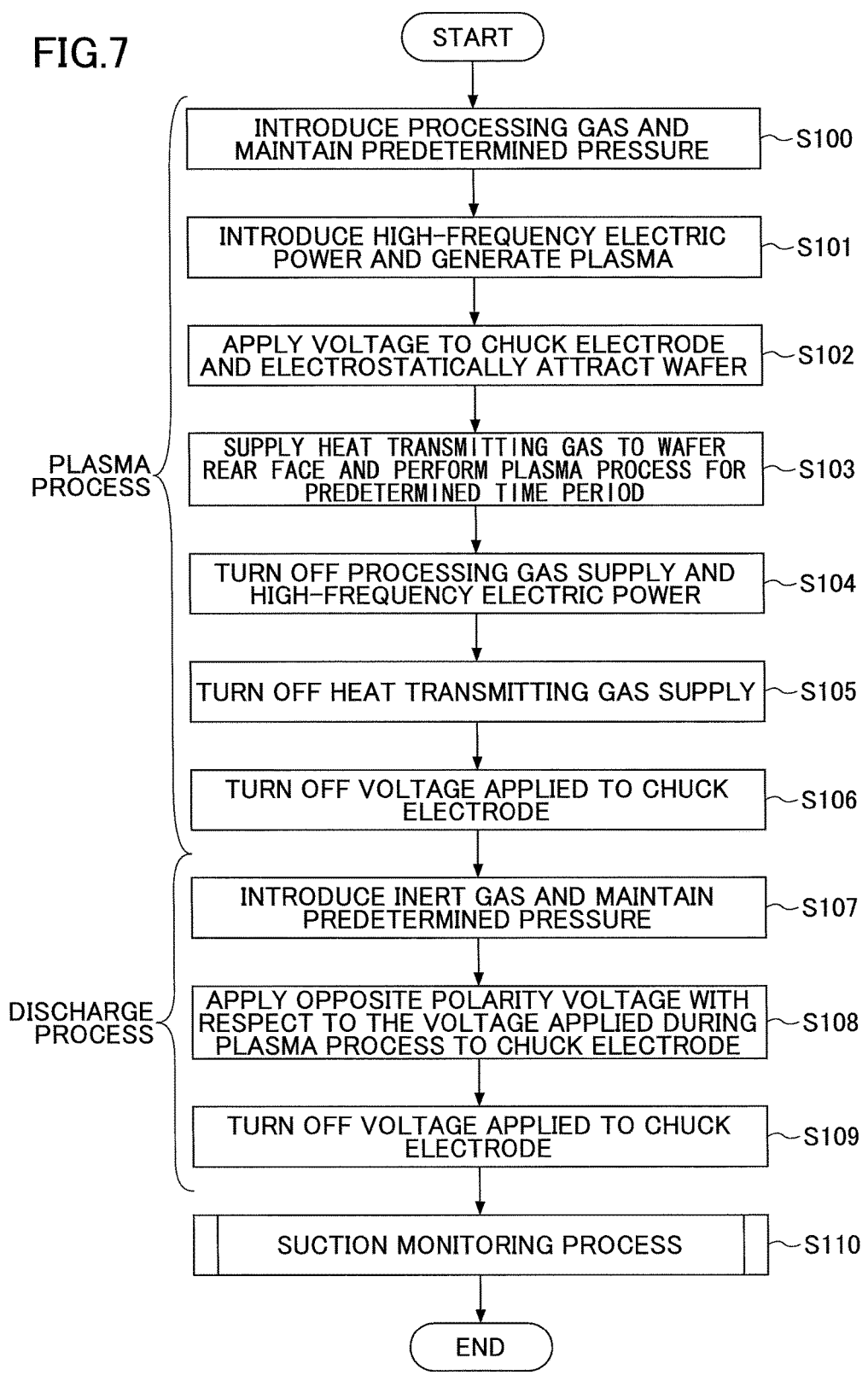
FIG. 7 is a flowchart showing exemplary process steps for performing a dechuck control method according to an embodiment of the present invention.

FIG. 7 is a flowchart showing process steps for executing the dechuck control method for dechucking the wafer W according to the present embodiment. It is noted that the plasma process is mainly controlled by the process executing unit 105, and the discharge process and the suction monitoring process are mainly controlled by the control unit 115.

First, when the wafer W is transported into the processing chamber 10 and the plasma process is started, a processing gas is introduced into the processing chamber 10 and the pressure within the processing chamber 10 is maintained at a predetermined pressure (S100). Then, a high-frequency electric power is introduced into the processing chamber 10 to generate plasma (S101). After plasma generation, a voltage is applied to the chuck electrode 40a so that the wafer W is electrostatically attracted to the electrostatic chuck 40 (S102). Then, a heat transmitting gas is supplied between the wafer W rear face and the electrostatic chuck 40 surface and a plasma process is performed for a predetermined period of time (S103). After the plasma process is completed, the supply of the processing gas and the high-frequency electric power is turned off (S104), the supply of the heat transmitting gas is turned off (S105), and the voltage applied to the chuck electrode 40a is turned off (S106).

In this way the plasma process may be completed, and a discharge process may be performed thereafter. To perform the discharge process, first, an inert gas is introduced into the processing chamber 10 and the pressure is maintained at a predetermined first pressure (e.g., 100-400 mTorr) (S107). Then, a voltage that is of the opposite polarity with respect to the voltage applied to the chuck electrode 40a during the plasma process is applied to the chuck electrode 40a (S108) after which the voltage applied to the chuck electrode 40a is turned off (S109). Then, the suction monitoring process is performed (S110) as is described below.

It is noted that the discharge process according to the present embodiment includes step S202 of FIG. 8 (described below) in addition to steps 107-109, which may be performed in a conventional discharge process. Also, it is noted that the pressure within the processing chamber 10 during the suction monitoring process is preferably arranged to be greater than or equal to the first pressure.

Figure 8:
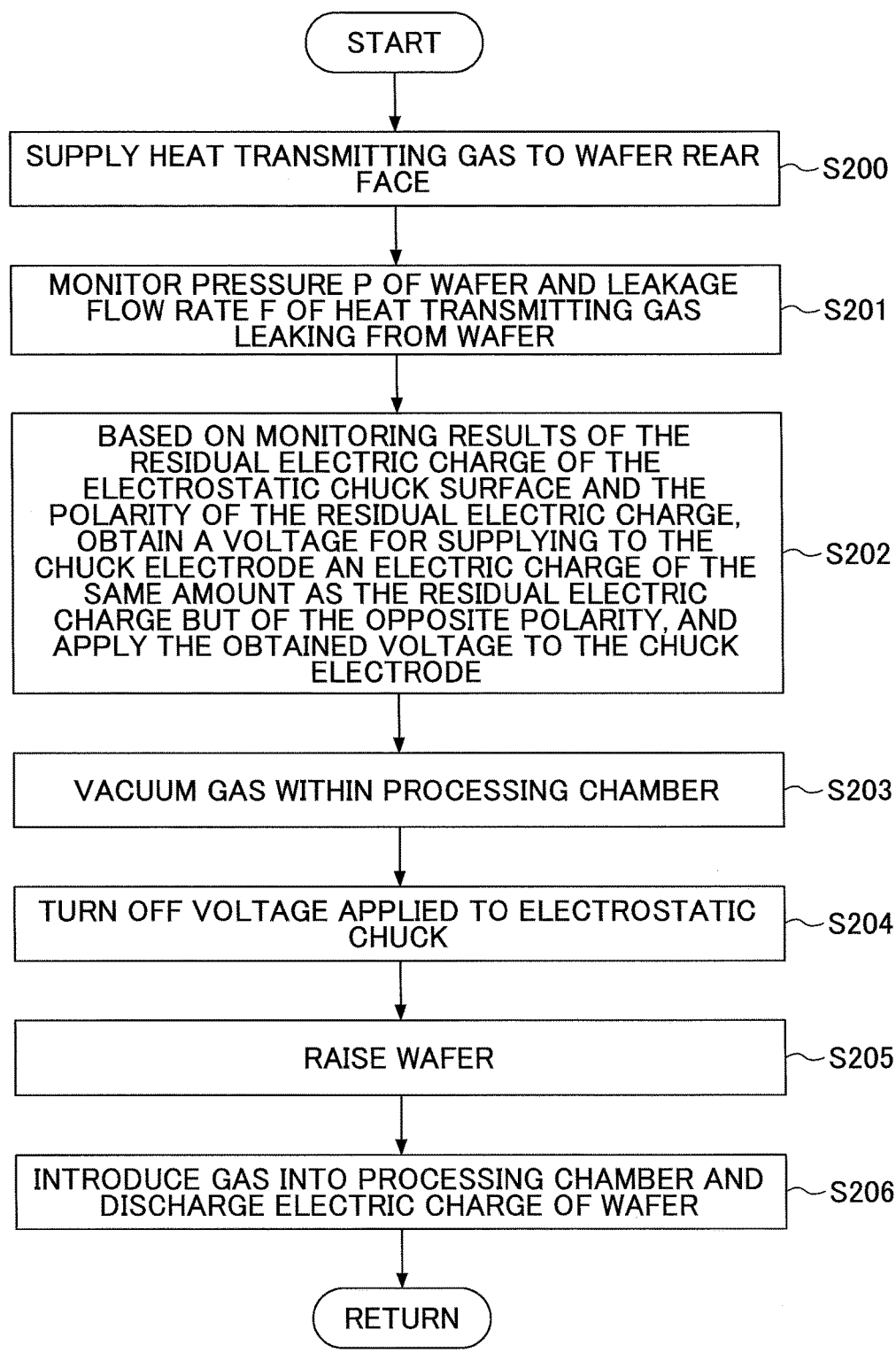
FIG. 8 is a flowchart showing exemplary process steps for performing a suction monitoring process according to an embodiment of the present invention.

FIG. 8 is a flowchart showing exemplary process steps of a suction monitoring process according to an embodiment of the present invention. In FIG. 8, first, a heat transmitting gas is supplied to the rear face of the wafer W (S200), and the pressure P of the wafer W rear face and the leakage flow rate F of the heat transmitting gas leaking from the wafer W are monitored (S201).

Then, a voltage for supplying to the chuck electrode 40a an electric charge that is of the same amount as the residual electric charge of the electrostatic chuck 40 surface but of the opposite polarity is obtained based on the monitoring results of the residual electric charge at the electrostatic chuck 40 surface and the polarity of the residual electric charge, and the obtained voltage is applied to the chuck electrode 40a (S202).

Then, gas within the processing chamber 10 used for performing the plasma process is vacuumed so that the pressure within the processing chamber 10 is reduced to a predetermined second pressure (S203). For example, the vacuuming may be completed in about three seconds. Thus, there is no substantial decrease in throughput as a result of performing such vacuuming process.

Then, the voltage applied to the electrostatic chuck 40 is turned off once again (S204), and the wafer W is raised by the support pins 81 (S205). Then, gas is introduced into the processing chamber 10 to remove the electric charge of the wafer W (S206), and the process is ended thereafter.

[Exemplary Effects]

FIGS. 9A-9D illustrate exemplary effects of the dechuck control method according to the present embodiment. That is, FIGS. 9A-9D indicate measurement results of the pressure P, the leakage flow rate F, the pin torque T, and the dechucked state of the wafer W when voltages of −1500 V, −1200 V, −1000 V, and −800 V are applied to the chuck electrode 40a in step S202 of FIG. 8 after which gas within the processing chamber 10 is vacuumed in step S203.

Figure 9:
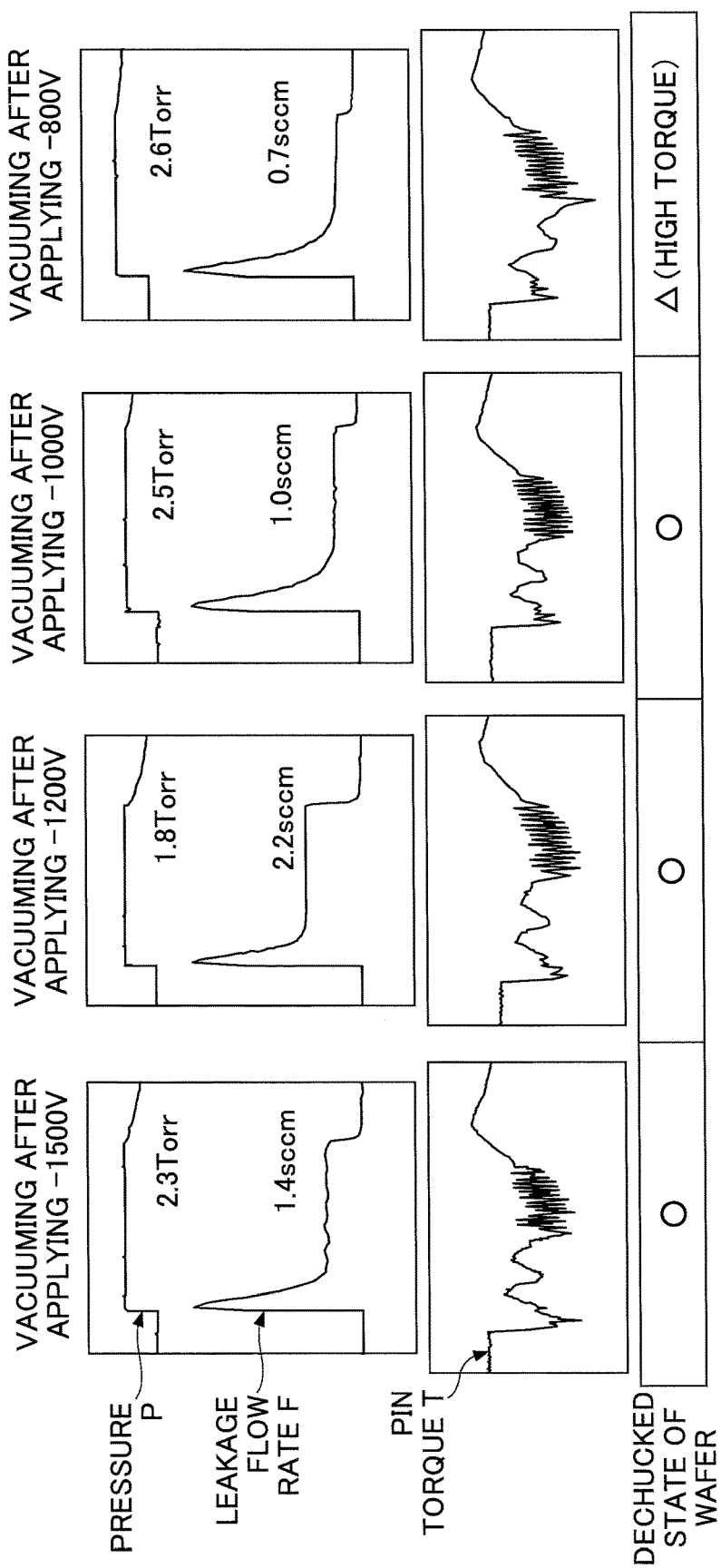
FIGS. 9A-9D are diagrams showing exemplary effects of vacuuming gas in the dechuck control method according to an embodiment of the present invention.

Of the exemplary measurement results shown in FIGS. 9A-9D, it can be appreciated that the decreasing speed of the pressure P is the fastest and the leakage flow rate F is the greatest when vacuuming is performed after a voltage of −1200 V is applied as is shown in FIG. 9B. The results indicate that the wafer W may be dechucked in a desirable manner under the condition of FIG. 9B.

Figure 10:
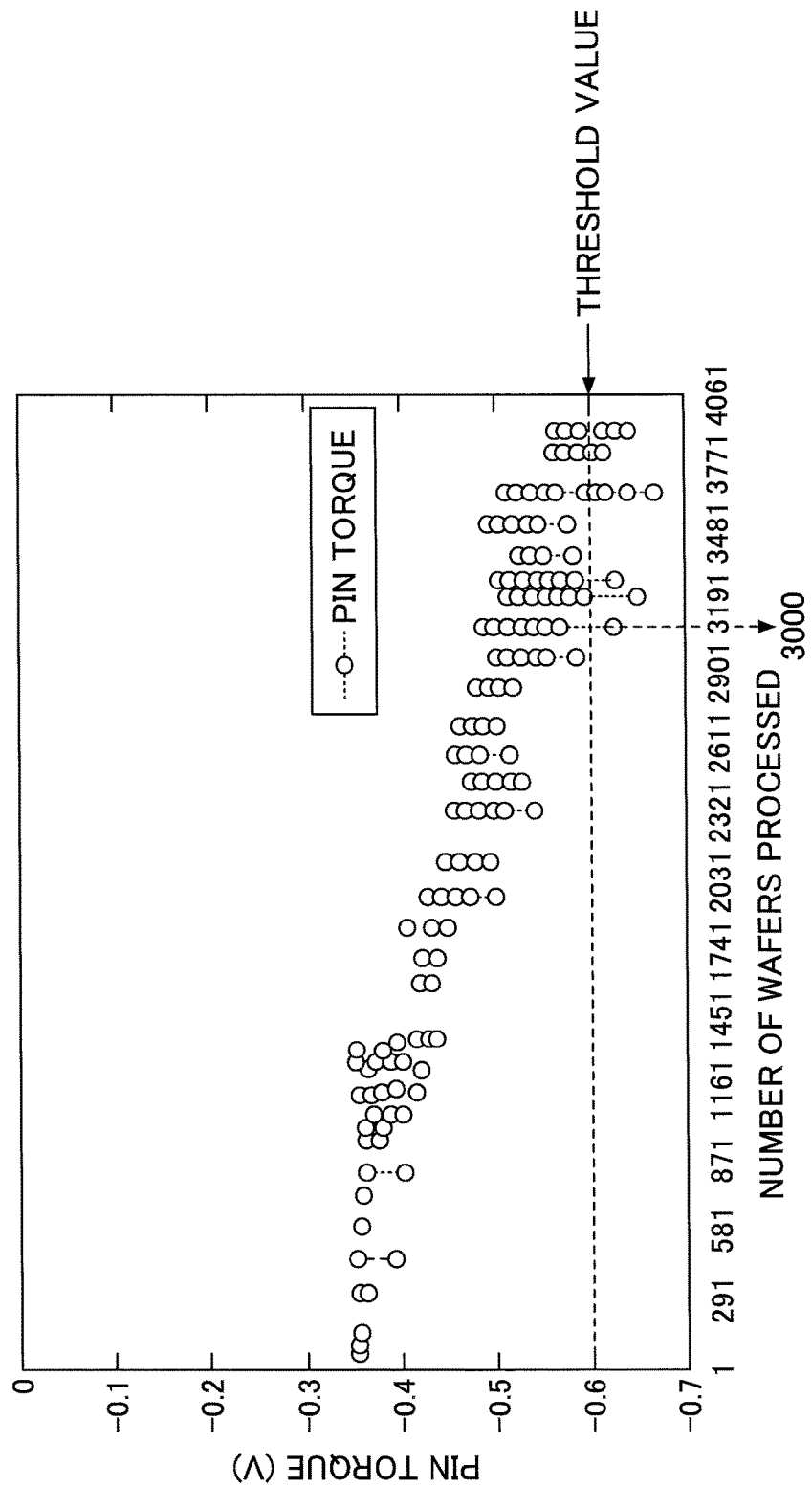
FIG. 10 is a graph showing a relationship between the number of wafers processed and the torque of support pins that raise the wafer.

However, even when vacuuming is performed after applying a voltage of −1500 V as is shown in FIG. 9A or when vacuuming is performed after applying a voltage of −1000 V as is shown in FIG. 9C, the pressure P is at 2.3 Torr and 2.5 Torr, respectively, which values are below the threshold value 2.6 Torr, thereby indicating that the wafer W may be dechucked in a desirable manner in these cases as well. In the case where vacuuming is performed after a voltage of −800 V is applied as is shown in FIG. 9D, the pressure P is at 2.6 Torr, which is equal to the threshold value 2.6 Torr. Also, the leakage flow rate F is 0.7 sccm, which is a relatively small value. However, in FIG. 9D, the value of the pin torque T after the gas flow is turned off is relatively large compared to the other examples shown in FIGS. 9A-9C. That is, when vacuuming is performed after a voltage of −800 V is applied as is shown in FIG. 9D, even if the wafer W may be dechucked, the high pin torque T may make it difficult to dechuck the wafer W. These results indicate that the state of the electrostatic chuck 40 surface may be roughly estimated based on the pressure P and the leakage flow rate F of the heat transmitting gas. It is noted that FIG. 10 shows exemplary measurements of the pin torque T of the support pins 81 in relation to the number of wafers processed. Such measurements may also be used to determine the state of the electrostatic chuck 40 surface as is described below.

As can be appreciated from above, in the dechuck control method according to the present embodiment, the voltage applied to the chuck electrode 40a after the plasma process is turned off, the pressure P of the heat transmitting gas supplied to the rear face of the wafer W and/or the leakage flow rate F of the heat transmitting gas leaking from the wafer W rear face are monitored, and a voltage for supplying to the chuck electrode 40a an electric charge that is of the same amount as the residual electric charge of the electrostatic chuck 40 surface but of the opposite polarity that is obtained based on the monitoring results is applied to the chuck electrode 40a. In this way, the wafer W may be dechucked from the electrostatic chuck in a desirable manner. For example, the wafer W may be dechucked from the electrostatic chuck 40 even in an emergency case where the wafer W cannot be dechucked from the electrostatic chuck 40 by merely applying an opposite polarity voltage as is done in a conventional discharge process.

[Modifications]

In the following, a dechuck control method according to a modified embodiment is described. In the dechuck control method according to the modified embodiment, a determination is made as to whether the wafer W can be dechucked based on monitoring results from monitoring He gas corresponding to an exemplary heat transmitting gas, and in certain cases, the wafer W dechucking process is stopped.

To execute the dechuck control method according to the modified embodiment, testing was conducted to determine a threshold value to be used for determining whether the wafer W can be dechucked. In the following, the process of determining the threshold value is described.

Figure 11:
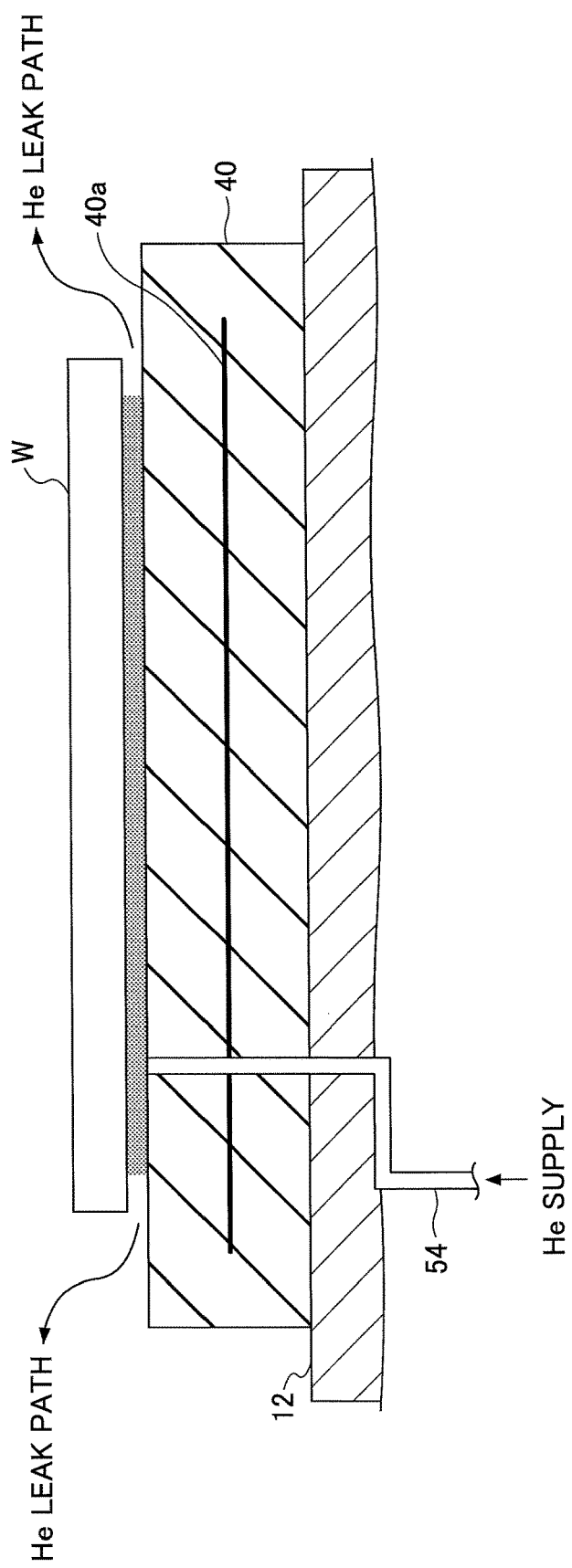
FIG. 11 is a diagram showing an exemplary He leak path that is monitored.

As is shown in FIG. 11, He gas to be monitored is supplied from the gas supply line 54 to the rear face of the wafer W above the electrostatic chuck 40. In this state, a voltage from the direct current voltage source 42 is applied to the chuck electrode 40a so that the wafer W may be fixed on the electrostatic chuck 40.

Figure 12:
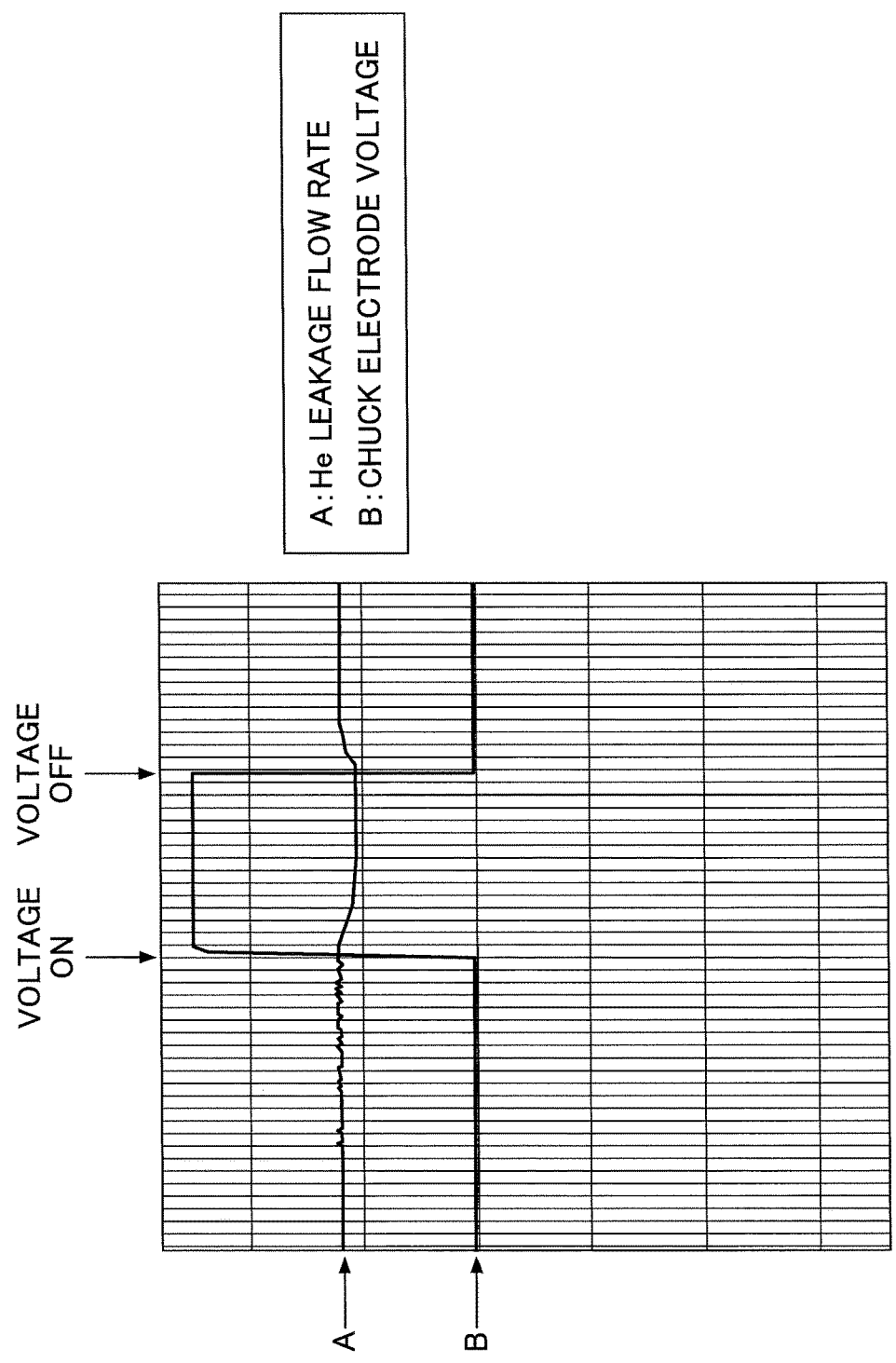
FIG. 12 is a diagram showing an exemplary relationship between the electrostatic chuck suction state and the He leakage flow rate.

In the modified embodiment, the He gas leakage flow rate of the He gas leaking outward from the gap between the edges of the wafer W and the electrostatic chuck 40 (He leak path shown in FIG. 11) is monitored. FIG. 12 shows the relationship between the He gas leakage flow rate A of the He gas leaking from the He leak path shown in FIG. 11 and the voltage B applied to the chuck electrode 40a.

When application of the voltage B on the chuck electrode 40a is turned on, the wafer W is attracted to the electrostatic chuck 40 surface. As a result, the He leak path shown in FIG. 11 becomes narrower and the He gas leakage flow rate A is decreased. When the application of the voltage B on the chuck electrode 40a is turned off, the wafer W is released from the suction force of the electrostatic chuck 40. As a result, the He leak path is widened, and the He gas leakage flow rate A is increased.

FIG. 13 is a table showing an exemplary relationship between the voltage applied to the chuck electrode 40a and the He leakage volume flow rate. When a voltage of 0 V is applied to the chuck electrode 40a, the wafer W is not suctioned (attracted) to the electrostatic chuck 40a and may be deemed to be in a discharge finished state. On the other hand, when a voltage of 2500 V is applied to the chuck electrode 40a, the wafer W is completely suctioned (attracted) to the electrostatic chuck 40 and may be deemed to be in a non-discharged state. Regarding the He leakage volume flow rates in these two cases, it can be appreciated that the He leakage volume flow rate in the discharge finished state (where the voltage is 0 V) is four times the He leakage volume flow rate in the non-discharged state (where the voltage is 2500 V).

Also, when the voltage applied to the chuck electrode 40a is 1000 V, the He leakage volume flow rate is 0.96 which is substantially the same as the He leakage volume flow rate 1 in the case where the voltage is 2500 V. That is, the wafer W is in a substantially non-discharged state when the voltage applied to the chuck electrode 40a is 1000 V, and the discharge of electric charges progresses as the applied voltage is reduced from 100 V to 0 V.

Figure 14:
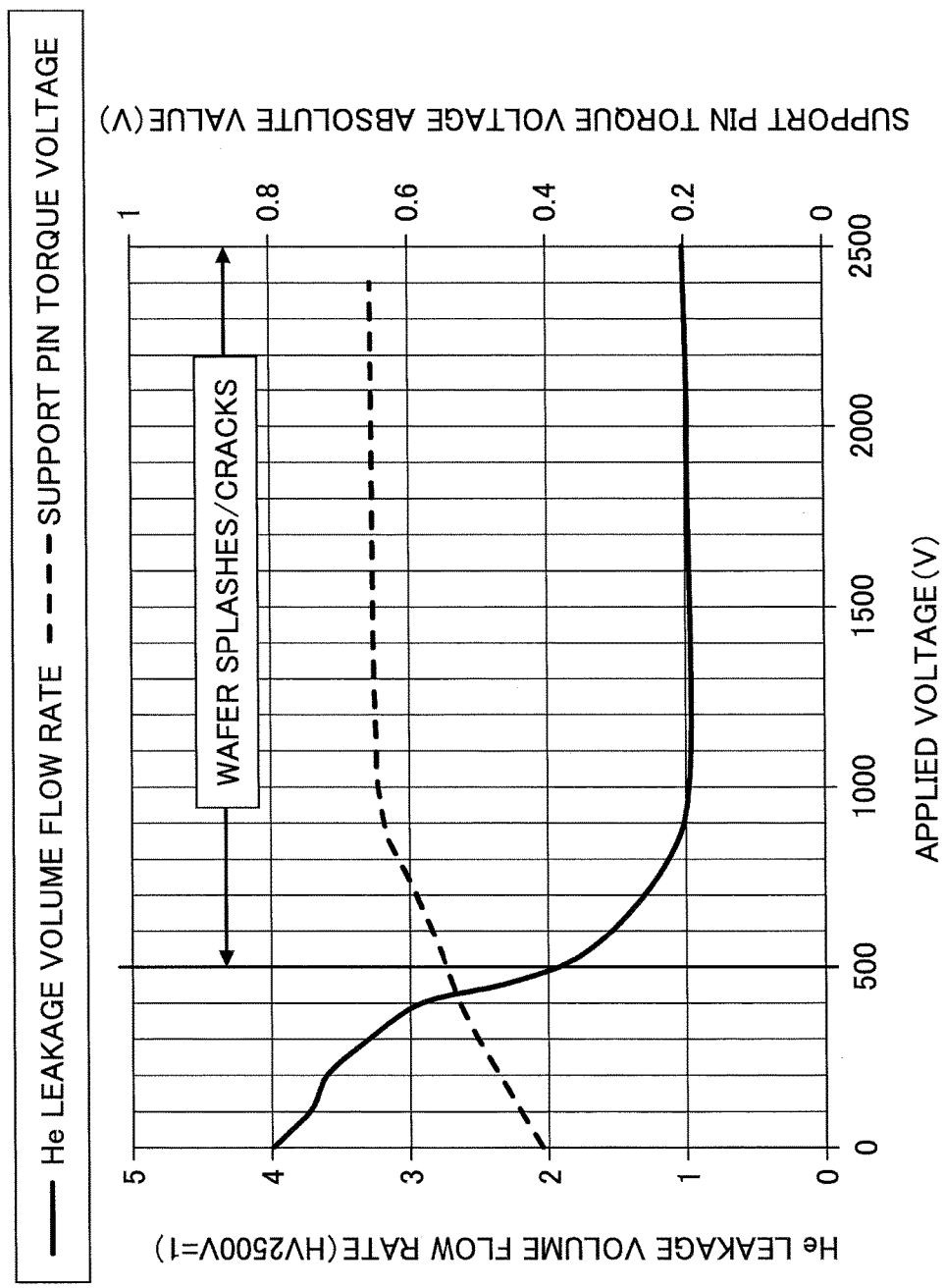
FIG. 14 is a graph showing an exemplary relationship between the He leakage volume flow rate and the support pin torque voltage.

FIG. 14 shows an exemplary relationship between the He leakage volume flow rate and the torque voltage of the support pins 81. It is noted that the solid line in FIG. 14 represents the He leakage volume flow rate indicated in FIG. 13. The dashed line in FIG. 14 represents the support pin torque voltage corresponding to the voltage of the torque exerted on the support pins 81 when raising the wafer W from the electrostatic chuck 40. As is described above in relation to the He leakage flow rate, discharge of the electric charge of the wafer W progresses as the voltage is decreased from 1000 V to 0 V. It has been observed that when the voltage applied to the chuck electrode 40a (applied voltage) is greater than or equal to 500 V, the electric charge of the wafer W may not be adequately discharged so that splashes and cracks are prone to occur at the wafer W.

Figure 15:
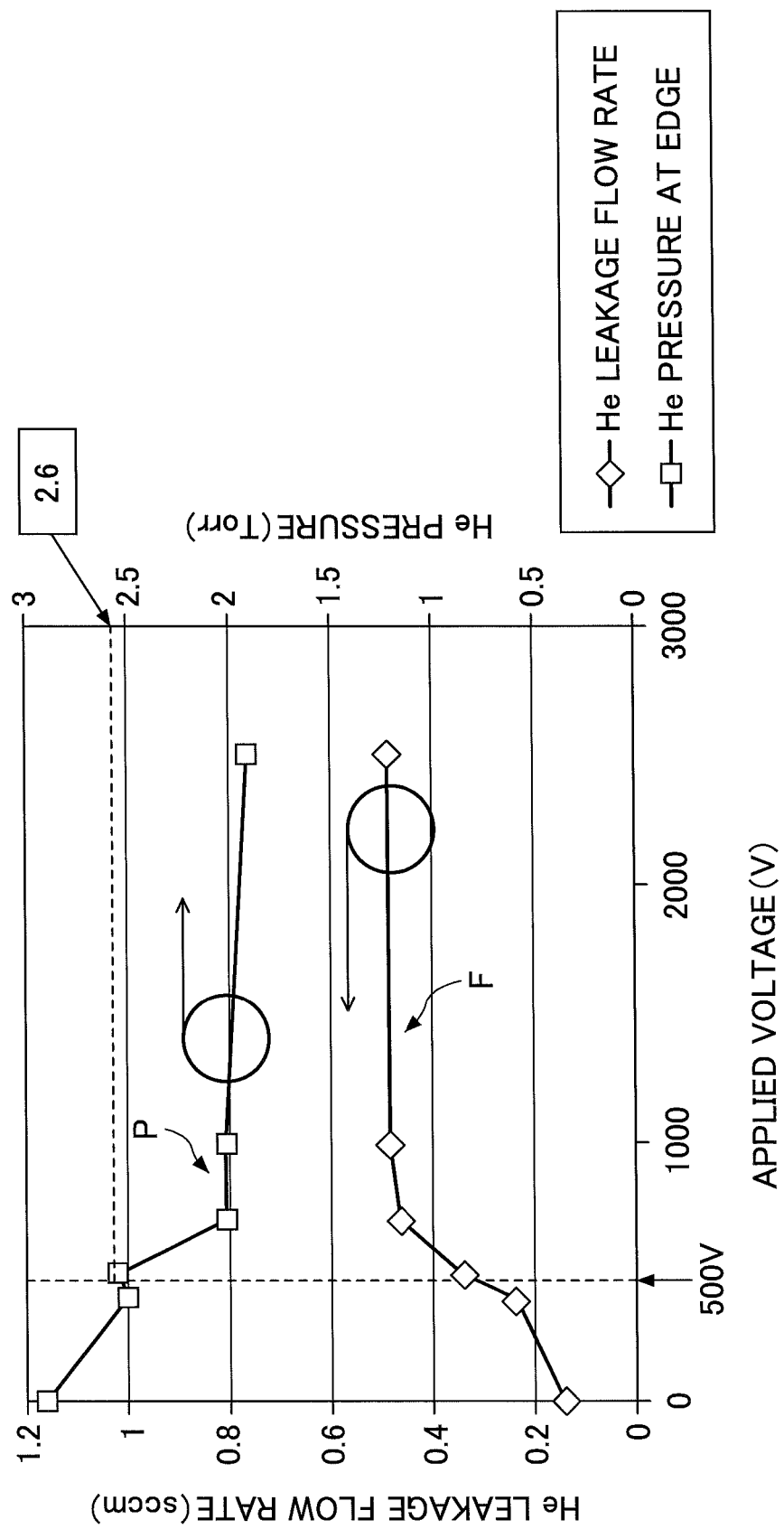
FIG. 15 is a graph showing an exemplary relationship between the He leakage flow rate and the He pressure.

FIG. 15 shows exemplary measurements indicating a relationship between the He leakage flow rate of the He gas leaking from the He leak path shown in FIG. 11 and the He pressure between the wafer W and the electrostatic chuck 40. Before measurement, a voltage of 2500 V was applied to the chuck electrode 40a to cause the wafer W to be electrostatically attracted to the electrostatic chuck 40. Then, discharge processes were conducted to achieve the applied voltages represented by the horizontal axis of FIG. 15. The measurement results reveal that when discharge voltages being supplied are within the range of 0 V to 1500 V; namely, when the applied voltage in FIG. 15 is within the range of 2500 V (corresponding to the initial state) to 1000 V, the He leakage flow rate F is substantially constant at approximately 0.5 sccm and the He pressure P is substantially constant at approximately 2 Torr (266 Pa). However, when the discharge voltages being supplied are within the range of 1500 V to 2500 V; namely, when the applied voltages in FIG. 15 are within the range of 1000 V to 0 V, the He leakage flow rate F suddenly decreases from approximately 0.5 sccm to approximately 0.18 sccm, and the He pressure suddenly increases from 2 Torr (266 Pa) to 3 Torr (400 Pa). That is, the measurement results indicate that suction of the wafer W to the electrostatic chuck 40 progresses while the applied voltage in FIG. 15 changes from 1000 V to 0 V.

Based on the measurement results of FIG. 15 and the fact that splashes and cracks are prone to occur at the wafer W when the voltage applied to the chuck electrode 40a (applied voltage) is greater than or equal to 500 V as indicated in FIG. 14, it may be determined that the He pressure at which discharge of the residual electric charge of the wafer W may be substantially completed and the wafer W may be dechucked from the electrostatic chuck 40 is 2.6 Torr (346.6 Pa) when the applied voltage in FIG. 15 is 500 V. Also, it may be determined that the He gas leakage flow rate at which discharge of the residual electric charge of the wafer W may be substantially completed and the wafer W may be dechucked from the electrostatic chuck 40 is 0.3 sccm when the applied voltage in FIG. 15 is 500V.

Thus, in one preferred embodiment, the dechuck control method may be automatically implemented when the pressure of He gas being monitored reaches 2.6 Torr or greater, or when the He gas leakage flow rate decreases to 0.3 sccm or less.

(First Modification)

In the dechuck control method according to the above modified embodiment, the He pressure of 2.6 Torr is determined to be the threshold value based on which a determination may be made as to whether the wafer W may be dechucked. FIG. 16 is a flowchart showing process steps for performing a suction monitoring process according to a first modified embodiment. The monitoring process of FIG. 16 is a modified embodiment of the suction monitoring process performed in step S110 of the dechuck control method shown in FIG. 7.

That is, the first modified embodiment of FIG. 16 relates to the suction monitoring process that is performed after the plasma process of steps S100-S106 and the discharge process of steps S107-S109 of FIG. 7.

The suction monitoring process according to the first modified embodiment is performed by the control unit 115. In FIG. 16, first, He gas is supplied to the rear face of the wafer W (S300). Then, after the pressure at the wafer W rear face stabilizes, the He gas supply is stopped, and the pressure P of the wafer W rear face is monitored for one second (S301).

Then, a determination is made as to whether the pressure P of the wafer W is greater than the threshold value 2.6 Torr (S302). FIGS. 17 and 18 show exemplary statuses of the electrostatic chuck 40 and the wafer W during the suction monitoring process. In FIGS. 17 and 18, the horizontal axis represents the time, line A represents the voltage supplied to the electrostatic chuck 40, line B represents the pressure P of the He gas at the center region of the wafer W rear face, line C represents the pressure of the He gas at the edge region of the wafer W rear face.

It is noted that in the present embodiment, He supply ports are divided into a center zone and an edge zone surrounding the center zone. In this way, the He gas supply may be controlled so that the pressure at the center region of the wafer W may be arranged to differ from that at the edge region of the wafer W. When suctioning the wafer W to the electrostatic chuck 40, portions of the wafer W having a large surface area may be more easily suctioned to the electrostatic chuck 40 compared to portions of the wafer W with a smaller surface area. Since the center region of the wafer W has a smaller surface area compared to the edge region of the wafer W, the suction force at the edge region of the wafer W is greater than the suction force at the center region. Thus, when gas is supplied from the two zones at the same flow rate and the pressure at the two zones are controlled to be the same, the He gas may flow from the center region of the wafer W to the edge region of the wafer W due to the greater suction force at the edge region compared to the center region thereby causing an imbalance. In such a case, in-plane consistency may not be maintained at the wafer W rear face and splashes are prone to occur at the wafer W, for example. Thus, in the present embodiment, the gas flow rate at the edge region of the wafer W is arranged to be higher than the gas flow rate at the center region of the wafer W so that the pressure at the edge region having a larger surface area may be arranged to be higher than the pressure at the center region having a smaller surface area.

In the example shown in FIGS. 17 and 18, the He gas is supplied to the wafer W in a manner such that the flow rate of the He gas supplied to the edge region is higher than the flow rate of the HE gas supplied to the center region so that the pressure at the edge region may be arranged to be higher than the pressure at the center region. Thus, after starting the He gas supply, the He pressure P at the edge region (line C) is higher than the He pressure P at the center region (line B).

It is noted that the pressure at the edge region is higher than the pressure at the center region so that the He gas at the edge region is more likely to leak outside the wafer W from the He leak path whereas the He gas at the center region is less likely to leak outside the wafer W. Accordingly, after the He gas supply is stopped, the pressure change at the edge region is greater than the pressure change at the center region. In the present embodiment, the pressure at the edge region with higher responsiveness (line C) is monitored. In the examples of FIGS. 17 and 18, the pressure at the wafer W rear face stabilizes about six seconds after starting the He gas supply. Thus, the He gas supply is stopped six seconds after starting the He gas supply, and the He pressure at the edge region of the wafer W is detected one second after stopping the He gas supply (i.e., starting the monitoring process). As a result, in FIG. 17, the He pressure at the edge region of the wafer W detected one second after stopping the He gas supply is approximately 2 Torr (266 Pa), which is less than the He pressure (alarm threshold value) 2.6 Torr, indicating that the water W may be dechucked.

Accordingly, in the example of FIG. 17, the control unit 115 determines that the wafer W may be dechucked, and the process moves on to step S303 of FIG. 16 where a voltage for supplying to the chuck electrode 40a an electric charge of the same amount as the residual electric charge of the electrostatic chuck 40 surface but of the opposite polarity is obtained based on the monitoring results of monitoring the residual electric charge of the electrostatic chuck 40 surface and the polarity of the residual electric charge, and the obtained voltage is applied to the chuck electrode 40a (S303).

Then, gas within the processing chamber 10 is vacuumed so that the pressure within the processing chamber 10 is reduced to the second pressure (S304). Then, the voltage applied to the electrostatic chuck 40 is turned off (S305), and the wafer W is raised by the support pins 81 (S306). Then, gas is introduced into the processing chamber 10 and the electric charge of the wafer W is removed (S307) at which point the present monitoring process is completed.

On the other hand, in the example shown in FIG. 18, the pressure at the edge portion of the wafer W detected one second after stopping the He gas supply is approximately 2.8 Torr (372.4 Pa), which is greater than the threshold value 2.6 Torr. In this case, the control unit 115 determines that the wafer W cannot be dechucked and the process proceeds from step S302 to step S308 where the dechuck process for dechucking the wafer W from the electrostatic chuck 40 is terminated. Also, the control unit 115 outputs an alarm signaling that the dechuck process has been terminated (S308) at which point the present monitoring process is completed.

As can be appreciated from above, in the present modified embodiment, the He pressure at the edge region of the wafer W is detected one second after stopping the He gas supply, and the wafer dechucking process is terminated if the detected pressure is greater than the threshold value 2.6 Torr. In this way, cracking and other damage to the wafer W may be prevented upon dechucking the wafer W.

It is noted that although the He pressure at the edge region of the wafer W is detected one second after stopping the He gas supply in the above first modified embodiment, the present invention is not limited to such example. In other embodiments, one or more sampling points may be designated over a time period during which an abrupt pressure change occurs after stopping the He gas supply. In this case, the pressure detected at each of the sampling points is compared with the alarm threshold value 2.6 Torr and if the detected pressure fails to fall below the alarm threshold value 2.6 Torr even at the last sampling point, the wafer dechucking process is terminated. In this way, cracking and other damage to the wafer W may be effectively prevented.

In one preferred embodiment, one or more sampling points may be designated over the time period during which the He pressure abruptly changes by at least 50% after stopping the He gas supply and the pressure of the He gas may be detected at each of these sampling points. It is noted that the time period during which the He pressure changes by at least 50% may be within one second as in the first modified embodiment or shorter than one second, for example. Also, it is noted that the He pressure may be monitored and detected once or plural times within the time period during which the He pressure changes by at least 50%.

(Second Modification)

In the following, a suction monitoring process according to a second modified embodiment is described. FIG. 19 is a flowchart showing process steps for executing the suction monitoring process according to the second modified embodiment. The suction monitoring process of FIG. 19 is another modification of the suction monitoring process performed in step S110 of the dechuck control method of FIG. 7.

The second modified embodiment of FIG. 19 differs from the first modified embodiment of FIG. 16 in that it includes step S310. That is, in the second modified embodiment, when the He pressure of the edge region detected one second after stopping the He gas supply is greater than the He pressure alarm threshold value 2.6 Torr, the control unit 115 does not immediately terminate the wafer W dechuck process but proceeds to step S310 where the control unit 115 determines whether the suction monitoring process steps (i.e., steps S300-S302) have been performed at least a predetermined number of times. If it is determined that the monitoring process steps have not been performed the predetermined number of times, the process goes back to step S300 so that the suction monitoring steps S300-S302 may be repeated. That is, the He gas is supplied again for six seconds after which the He gas supply is stopped and the pressure at the edge region of the wafer W rear face is detected one second after stopping the He gas supply. Then, a determination is made as to whether the detected pressure is greater than the alarm threshold value 2.6 Torr.

In the present modified embodiment, the process steps S300-S302 and S310 may be repeated multiple times, and if the detected pressure falls below the threshold value 2.6 Torr before the above suction monitoring process steps are repeated the predetermined number of times, the wafer W dechuck process steps (S304-S307) may be performed. On the other hand, when the detected pressure does not fall below the threshold value 2.6 Torr before the above suction monitoring process steps S300-S302 and S310 are repeated the predetermined number of times, the process proceeds to step S308 where the process of dechucking the wafer W from the electrostatic chuck 40 is terminated. Also, the control unit 115 outputs an alarm signaling the termination of the dechuck process (S308) at which point the present monitoring process is completed.

As can be appreciated, in the present modified embodiment, the He pressure at the edge region of the wafer W rear face is detected one second after stopping the He gas supply, and if the detected pressure is greater than the threshold value 2.6 Torr, the suction monitoring process steps may be repeated up to a predetermined number of times. If the detected He pressure does not fall below the threshold value 2.6 Torr even after repeating the suction monitoring process steps the predetermined number of times, the control unit 115 determines that the wafer W cannot be dechucked from the electrostatic chuck 40 and the dechuck process is terminated. According to an aspect of the present embodiment, the process of dechucking the wafer W is performed if possible to reduce the instances of terminating the dechuck process while effectively preventing cracks and other damage to the wafer W.

It is noted that in the above modified embodiment, a process of detecting the He pressure at least once within the time period during which the He pressure changes by at least 50% after stopping the He gas supply is repeated a predetermined number of times while the detected He pressure is greater than the threshold value 2.6 Torr. It is noted that in some embodiments, even when the He pressure detected in the last detection process is greater than the threshold value 2.6 Torr, the dechuck process may still be performed if at least one of the He pressures detected in a previous detection process is below the threshold value 2.6 Torr. In other embodiments, when the He pressure detected in the last detection process is greater than the threshold value 2.6 Torr, the dechuck process may be terminated even if the He pressure detected in a previous detection process is below the threshold value 2.6 Torr.

Also, it is noted that in the above modified embodiments, the pressure of the He gas at the wafer W rear face is monitored. However, in other embodiments, the He gas flow rate at the wafer W rear face may be monitored instead, for example.

Also, it is noted that in a case where the He gas supply ports are divided into plural zones, the pressure of the He gas being supplied may be varied with respect to the radial direction. In a case where plural gas supply ports are provided, the pressure of the He gas supplied from the outermost gas supply port is preferably monitored. In this way, the most abrupt pressure change may be monitored so that accuracy of the dechuck control method may be improved. For example, in the case where the He gas supply ports are divided into two zones as in the above modified embodiment, the He gas supply port arranged at the outer zone may be monitored. In a case where only one zone is provided, any of the supply ports may be monitored.

Further, the present invention is not limited to these embodiments, and numerous variations and modifications may be made without departing from the scope of the present invention.

For example, the dechuck control method according to an embodiment of the present invention may be performed on the electrostatic chuck 40 after a predetermined time period elapses. That is, the dechuck control method according to an embodiment of the present invention may be used to control the dechuck process for dechucking a wafer W from the electrostatic chuck 40 that has been in use for over a predetermined period of time, for example.

For example, as is shown in FIG. 10, the torque T of the motor 84 driving the support pins 81 used for raising the wafer W upon dechucking the wafer W may be monitored. In this way, degradation of the wafer dechucking operations over time (e.g., due to increased residual electric charge) may be monitored. For example, the electrostatic chuck 40 may be deemed to have been in use over the predetermine period of time when the pin torque T represented by the vertical axis in FIG. 10 reaches a predetermined threshold value and the dechuck control method according the an embodiment of the present invention may be automatically implemented when the pin torque T reaches the predetermined threshold value. In FIG. 10, the pin torque T falls below the threshold value when the number of wafers processed reaches 3000. Accordingly, the electrostatic chuck 40 surface may be deemed to have been degraded from use at this point, and the dechuck control method according to an embodiment of the present invention may be automatically implemented, for example.

It is noted that although the plasma processing apparatus according to the above embodiment is arranged to perform a plasma etching process as an exemplary plasma process, in other embodiments, the plasma processing apparatus may be configured to perform other plasma processes such as plasma chemical vapor deposition (CVD) for forming a thin film on the wafer W through CVD, plasma oxidation, plasma nitriding, sputtering, or ashing, for example.

Also, the plasma processing apparatus according to an embodiment of the present invention is not limited to a capacitively coupled plasma (CCP) processing apparatus that generates CCP through the discharge of a high-frequency electric power generated between parallel plate electrodes within a processing chamber. For example, embodiments of the present invention may also be applied to an ICP (inductively coupled plasma) processing apparatus that includes an antenna arranged at the upper face or the periphery of a processing chamber and generates ICP under a high-frequency induction field, or a microwave plasma processing apparatus that generates plasma wave plasma using the power of a microwave.

Also, the processing object that is to undergo the plasma process is not limited to a semiconductor wafer. For example, the processing object may be a large substrate for a flat panel display (FPD), a substrate for an electroluminescence (EL) device, or a substrate for a solar cell.

It is noted that a dechuck control method according to an embodiment of the present invention is for dechucking a processing object from an electrostatic chuck that electrostatically attracts the processing object and includes a chuck electrode, and may include the steps of turning off the voltage applied to the chuck electrode after a plasma process, applying an opposite voltage that is of the opposite polarity from the voltage applied to the chuck electrode during suctioning by the electrostatic chuck, turning off the opposite voltage, and evacuating the gas within the processing chamber.

What is claimed is:

1. A dechuck control method for dechucking a processing object from an electrostatic chuck that electrostatically attracts the processing object and includes a chuck electrode, the method comprising the steps of:

performing a discharge process after a plasma process and after turning off the chuck electrode by introducing an inert gas into a processing chamber and maintaining a pressure within the processing chamber at a first pressure for dechucking, the inert gas being introduced above the processing object;

monitoring at least one of a pressure of a heat transmitting gas supplied to a rear face of the processing object that is placed on the electrostatic chuck and a leakage flow rate of the heat transmitting gas leaking from the rear face of the processing object;

obtaining an amount of residual electric charge of a surface of the electrostatic chuck and a polarity of the residual electric charge based on a monitoring result of the monitoring step, obtaining a voltage for supplying to the chuck electrode an electric charge that is of the same amount as the residual electric charge and of the opposite polarity with respect to the polarity of the residual electric charge, and applying the obtained voltage to the chuck electrode;

evacuating the inert gas within the processing chamber while applying the obtained voltage to the chuck electrode and reducing the pressure within the processing chamber to a second pressure by at least one digit from the first pressure for dechucking the processing object; and turning off the obtained voltage applied to the electrostatic chuck and dechucking the processing object from the electrostatic chuck using a support pin.

2. The dechuck control method as claimed in claim 1, wherein the second pressure is achieved by vacuuming the inert gas until the pressure within the processing chamber is reduced to a pressure at which movement of an electric charge of the processing object through gas within the processing chamber ceases to occur according to Paschen's Law.

3. The dechuck control method as claimed in claim 1, wherein a pressure within the processing chamber during the monitoring step is greater than or equal to the first pressure.

4. The dechuck control method as claimed in claim 3, further comprising the steps of raising the processing object from the electrostatic chuck using the support pin after turning off the obtained voltage applied to the chuck electrode and reintroducing gas into the processing chamber.

5. The dechuck control method as claimed in claim 1, wherein the surface of the electrostatic chuck includes a dielectric member that covers the chuck electrode; and
a volume resistivity of the dielectric member is greater than or equal to $1 \times 10^{14}$ Ωcm.

6. The dechuck control method as claimed in claim 1, wherein the dechuck control method is automatically implemented upon dechucking the processing object from the electrostatic chuck that has been in use for at least a predetermined period of time.

7. The dechuck control method as claimed in claim 6, wherein the dechuck control method is automatically implemented upon dechucking the processing object from the electrostatic chuck in at least one of a first case where the detected pressure value of the heat transmitting gas is greater than or equal to 2.6 Torr (346.6 Pa) and a second case where the leakage flow rate of the heat transmitting gas leaking from the rear face of the processing object is less than or equal to 0.3 sccm.

8. The dechuck control method as claimed in claim 1, wherein the monitoring step includes
detecting at least one pressure value of the heat transmitting gas within a time period after stopping the supply of the heat transmitting gas during which time period the pressure of the heat transmitting gas changes by at least 50%; and stopping the dechucking step of dechucking the processing object from the electrostatic chuck when the detected pressure value of the heat transmitting gas is greater than 2.6 Torr (346.6 Pa).

9. The dechuck control method as claimed in claim 8, wherein the time period during which the pressure of the heat transmitting gas changes by at least 50% is within one second.

10. The dechuck control method as claimed in claim 8, wherein the monitoring step includes
repeating the detecting step of detecting at least one pressure value of the heat transmitting gas within the time period during which the pressure of the heat transmitting gas changes by at least 50%, the detecting step being repeated up to a predetermined number of times while the detected pressure value is greater than 2.6 Torr (346.6 Pa); and stopping the dechucking step of dechucking the processing object from the electrostatic chuck using the support pin when the detected pressure value continues to be greater than 2.6 Torr (346.6 Pa) after repeating the detecting process the predetermined number of times.

11. The dechuck control method as claimed in claim 1, wherein when the heat transmitting gas is supplied from plural heat transmitting gas supply ports, the monitoring step includes monitoring at least one of a pressure of the heat transmitting gas supplied from an outermost heat transmitting gas supply port of the heat transmitting gas supply ports and the leakage flow rate of the heat transmitting gas leaking from the rear face of the processing object.

12. The dechuck control method as claimed in claim 1, wherein the inert gas is introduced from a ceiling of the process chamber, said ceiling being located vertically above the processing object.

13. The dechuck control method as claimed in claim 1, wherein the discharge process includes applying opposite polarity voltage relative to the voltage applied during the plasma process to the chuck electrode and turning off the voltage applied to the chuck electrode.

14. The dechuck control method as claimed in claim 1, further comprising turning off heat transmitting gas supply and the voltage applied to the chuck electrode before performing the discharge process.

15. The dechuck control method as claimed in claim 1, wherein each of the first and second pressure is defined as a pressure outside an area between the chuck and the processing object within the chamber, and wherein the evacuating step is performed by depressurizing at least a space above the processing object within the chamber.

16. The dechuck control method as claimed in claim 1 further comprises introducing the heat transmitting gas to the rear face of the processing object while not supplying a voltage to the chuck electrode after the introducing the inert gas.

17. A plasma processing apparatus comprising:
an electrostatic chuck that electrostatically attracts a processing object and includes a chuck electrode;
a control unit configured to perform a discharge process after a plasma process and after turning off the chuck electrode by introducing an inert gas into a processing chamber and maintaining a pressure within the processing chamber to a first pressure for dechucking, the inert gas being introduced above the processing object;

a gas supply source that introduces a heat transmitting gas to a rear face of the processing object; and a monitor that detects at least one of a pressure of the heat transmitting gas supplied to the rear face of the processing object that is placed on the electrostatic chuck and a leakage flow rate of the heat transmitting gas leaking from the rear face of the processing object;

wherein the control unit configured to perform the steps of applying a voltage obtained based on a monitoring result of the monitor to the chuck electrode, evacuating the inert gas within the processing chamber, and reducing the pressure within the processing chamber to a second pressure by at least one digit from the first pressure for dechucking the processing object; and turning off the voltage applied to the chuck electrode and dechucking the processing object from the electrostatic chuck using a support pin.

18. The plasma processing apparatus as claimed in claim 17, wherein the gas supply source introduces the heat transmitting gas to the rear face of the processing object while not supplying a voltage to the chuck electrode after the introducing the inert gas.

\* \* \* \* \*